(12) United States Patent
Fackenthal

(10) Patent No.: US 11,256,566 B2
(45) Date of Patent: Feb. 22, 2022

(54) ENHANCED BIT FLIPPING SCHEME

(71) Applicant: Micron Technology, Inc., Boise, ID (US)

(72) Inventor: Richard E. Fackenthal, Carmichael, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/016,004

(22) Filed: Sep. 9, 2020

(65) Prior Publication Data

US 2020/0409785 A1 Dec. 31, 2020

Related U.S. Application Data

(62) Division of application No. 16/104,470, filed on Aug. 17, 2018, now Pat. No. 10,802,909.

(51) Int. Cl.
*G06F 11/10* (2006.01)
*H03M 13/37* (2006.01)

(52) U.S. Cl.
CPC ...... *G06F 11/1048* (2013.01); *G06F 11/1076* (2013.01); *H03M 13/37* (2013.01)

(58) Field of Classification Search
None
See application file for complete search history.

(56) References Cited

U.S. PATENT DOCUMENTS

| | | | |
|---|---|---|---|
| 5,644,583 A * | 7/1997 | Garcia | G06F 11/1044 714/764 |
| 6,292,868 B1 * | 9/2001 | Norman | G11C 16/10 365/202 |
| 6,563,745 B1 * | 5/2003 | Ilkbahar | G11C 16/10 365/189.02 |

(Continued)

FOREIGN PATENT DOCUMENTS

| | | |
|---|---|---|
| CN | 101681284 A | 3/2010 |
| KR | 20150106916 A | 9/2015 |

(Continued)

OTHER PUBLICATIONS

R. Maddah, S. Cho and R. Melhem, "Power of One Bit: Increasing Error Correction Capability with Data Inversion," 2013 IEEE 19th Pacific Rim International Symposium on Dependable Computing, 2013, pp. 216-225.*

(Continued)

*Primary Examiner* — Steve N Nguyen
(74) *Attorney, Agent, or Firm* — Holland & Hart LLP

(57) ABSTRACT

Methods, systems, and devices for operating memory cell(s) using an enhanced bit flipping scheme are described. An enhanced bit flipping scheme may include methods, systems, and devices for performing error correction of data bits in a codeword concurrently with the generation of a flip bit that indicates whether data bits in a corresponding codeword are to be flipped; for refraining from performing error correction of inversion bit(s) in the codeword; and for generating a high-reliability flip bit using multiple inversion (Continued)

bits. For instance, a flip bit that is even more reliable may be generated by determining whether a number of, a majority of, or all of the inversion bits indicate that the data bits are in an inverted state.

20 Claims, 10 Drawing Sheets

(56) References Cited

U.S. PATENT DOCUMENTS

| | | | | |
|---|---|---|---|---|
| 6,996,660 | B1* | 2/2006 | Moore | G11C 17/146 |
| | | | | 365/185.13 |
| 7,102,544 | B1* | 9/2006 | Liu | G06F 11/1032 |
| | | | | 341/50 |
| 8,656,257 | B1 | 2/2014 | Micheloni et al. | |
| 8,767,483 | B2* | 7/2014 | Brown | G06F 11/183 |
| | | | | 365/189.07 |
| 9,494,647 | B1* | 11/2016 | Chuang | G11C 16/26 |
| 2002/0042899 | A1 | 4/2002 | Tzannes et al. | |
| 2003/0066005 | A1* | 4/2003 | Iglesia | G06F 13/4217 |
| | | | | 714/752 |
| 2013/0036341 | A1 | 2/2013 | Oneill et al. | |
| 2015/0229337 | A1 | 8/2015 | Alhussien et al. | |

FOREIGN PATENT DOCUMENTS

| | | |
|---|---|---|
| KR | 20160055936 A | 5/2016 |
| KR | 20170101368 A | 9/2017 |
| KR | 20180013212 A | 2/2018 |

OTHER PUBLICATIONS

ISA/KR, International Search Report and Written Opinion of the International Searching Authority, Int'l. Appl. No. PCT/US2019/044874, dated Dec. 20, 2019, Korean Intellectual Property Office, Seo-gu, Daejeon, Republic of Korea, 15 pgs.

KIPO, "Notice of Allowance," issued in connection with Korean Patent Application No. 10-2021-7007264, dated Apr. 13, 2021 (4 pages).

China National Intellectual Property Administration, "First Office Action," and "First Search" issued in connection with Chinese Patent Application No. 201980052287.3, dated Jul. 28, 2021 (25 pages with Translation).

* cited by examiner

ENHANCED BIT FLIPPING SCHEME

CROSS REFERENCE

The present application for patent is a divisional of U.S. patent application Ser. No. 16/104,470 by Fackenthal, entitled "ENHANCED BIT FLIPPING SCHEME," filed Aug. 17, 2018, assigned to the assignee hereof, and which is expressly incorporated by reference in its entirety herein.

BACKGROUND

The following relates generally to operating a memory array and more specifically to an enhanced bit flipping scheme.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory (e.g., FeRAM, PCM, RRAM) may maintain their stored logic state for extended periods of time even in the absence of an external power source. Volatile memory devices (e.g., DRAM) may lose their stored state over time unless they are periodically refreshed by an external power source.

A memory device may invert data bits stored at memory cell(s) (e.g., for reliability reasons). A bit may indicate that the logic state stored at the particular memory cell(s) is inverted. Performing error correction for a bit related to inversion, however, may delay an access operation and this delay may be compounded by propagation delays when a read operation accesses a section of memory, introducing significant latency into a memory system. Enhanced schemes related to bit flipping and error correction operations are desired.

DETAILED DESCRIPTION

Figure 1:
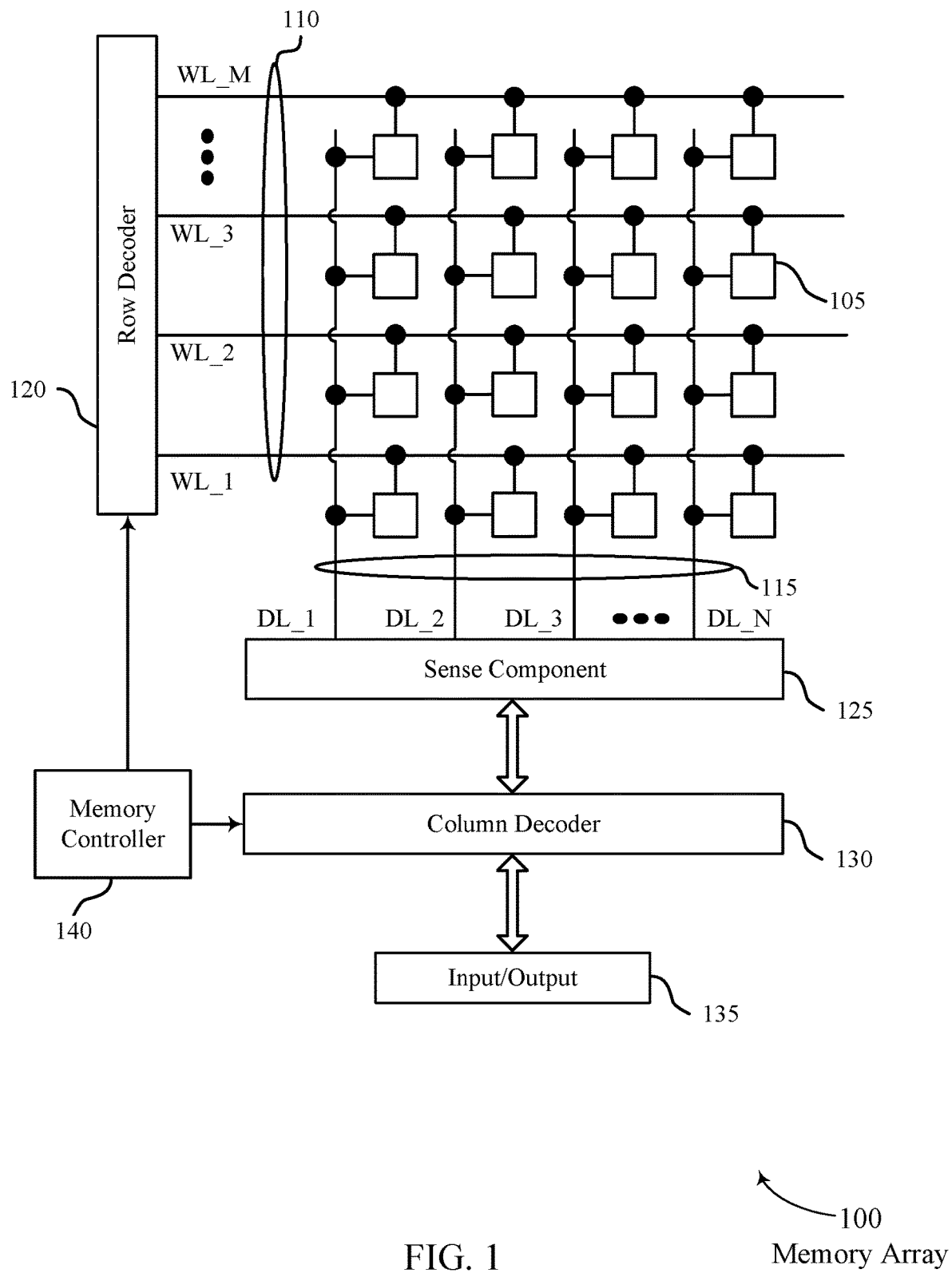
FIG. 1 illustrates an example memory array that supports an enhanced bit flipping scheme in accordance with various aspects of the present disclosure.

A memory device may invert data bits stored at memory cell(s) (e.g., for reliability reasons). After inverting one or more data bit(s) for particular memory cell(s), the memory device may set an inversion bit to indicate that the logic state stored at the particular memory cell(s) is inverted. When reading data from memory, the memory device may error correct the data and inversion bits and may determine whether any of the data bits have been inverted based on a corresponding error corrected inversion bit. However, performing error correction for an inversion bit may delay a read operation. Also, this delay may be compounded by propagation delays when a read operation accesses an entire section of memory, introducing significant latency into a memory system.

The memory device may include a memory array having a large number of memory cells (e.g., millions) and the memory array may be partitioned into discrete portions. For example, a memory array may be partitioned into memory sections, codewords, and/or memory units, where a memory section may include multiple codewords, and a codeword may include multiple memory units. In some examples, a memory section may correspond to a page size, a codeword corresponds to a prefetch size, and a memory unit may correspond to a determined number of bits (e.g., 4 bits). In a physical implementation of the memory array, a memory section may include many memory cells (e.g., thousands) spanning a large physical distance (e.g., ~1 mm).

Information may be stored in the memory array according to the partitioned memory resources. For example, particular information (e.g., user data) may be stored in a codeword. A codeword may be separated into a data portion including data bits and a control portion including control bits, such as redundant, error detection/correction ("error correcting"), and/or inversion bits. The data bits may represent data for an application using the memory array for storage. The redundant bits may be used to replace particular data and control bits during an operation known as redundancy repair. Error correcting bit(s) (e.g., parity bits) may be used to identify data and inversion bits that have been corrupted. Together, the redundant and error correcting bits may decrease the number of read errors that may occur when data bits are accessed, increasing the reliability of a memory device. The inversion bit may indicate whether the data, redundant, and/or error correcting bits originally stored in the first codeword of memory are in an inverted state—bits stored in a memory array may be inverted to save power, for reliability reasons, and the like.

Information may also be read from the memory array according to the partitioned memory resources. For example, data stored in a codeword may be requested from a memory array and delivered to a requesting device (e.g., another memory component or external device). After receiving the request, but before delivering the data bits included in the codeword to the requesting device, the memory array may process the codeword—e.g., to repair errors, flip the bits stored in the codeword.

For example, during a read operation, a data portion of the codeword may be processed through a data component and a control portion of the codeword may be processed through a control component as follows. First, redundant bit(s) may be used to replace certain data, error correction, and/or inversion bits. Next, the error correction bit(s) may be used to determine if any data or inversion bits in the codeword have been corrupted (e.g., using a Hamming code) and to generate syndrome bit(s) identifying any errors and the location of such errors in the codeword based on the determination.

The syndrome bits may then be provided (provided, transmitted, and communicated may be used interchangeably) to the data and control components and used to fix any identified errors in the data or inversion bits. In some cases, the fraction of bits that contain errors before performing error correction is referred to as the raw bit error rate (RBER) and the fraction of bits that contain errors after performing error correction is referred to as the uncorrectable bit error rate (UBER).

After the syndrome bits have been processed, the error corrected inversion bit—which may be referred to as a "flip bit"—may be transmitted to a bit flipping component in the data component. If the flip bit indicates that the data bits are in an inverted state, the error corrected data bits may be flipped (e.g., so that the error corrected data bits are returned to their originally stored values before being provided to the requesting device). Otherwise, if the flip bit indicates that the data bits are in an original state (e.g., are not currently inverted), the error corrected data bits may be provided directly to the requesting device without a flipping operation being performed.

As mentioned herein, performing the error correction on at least some if not all of the bits in a codeword—including the inversion bit—may increase the likelihood that the correct data bits are delivered to a requesting device (e.g., by ensuring that the data bits are correct and are not mistakenly flipped), which may in turn increase the reliability of a memory device. Waiting to send the flip bit until after the syndrome bits are processed, however, may introduce latency into a memory system in certain examples.

In some cases, all the data stored in a memory section may be provided to a requesting device in response to a request for data located in a codeword of the section, which may result in propagation delays. As discussed herein, a memory section may be spread across multiple memory cells spanning large physical distances—e.g., distances large enough to introduce latency into a memory system by way of propagation delays. In some cases, distributing control information, such as redundant bits, error correction bits, syndrome bits, and/or inversion bits, across a memory section results in increased latency for a memory operation. For instance, a memory system may incur a propagation delay while waiting for syndrome bits to be distributed across a memory section.

Such propagation delays may be exacerbated by serial control operations. That is, the aggregate propagation delay for a memory operation may be increased each time control information is provided across a memory section. For example, the read operation discussed herein may incur a first propagation delay when distributing the syndrome bits across a memory section. And may incur another propagation delay when distributing the error corrected inversion bits across the memory section. In such cases, performing error correction on the inversion bits before performing a flipping operation may increase the latency of a memory operation by the aggregate of both propagation delays, decreasing the throughput of a memory device. In some cases, performing error correction on the inversion bits in a memory section results in a 1 ns delay.

In some cases, certain steps of a memory operation may be omitted and/or performed in parallel with other steps. This way, the propagation delay for a particular step may not add latency into a memory operation.

For example, error correction may not be performed for an inversion bit associated with a codeword and a flip bit that is the same as, or is determined based on, the inversion bit may be provided to a data component before or concurrently with the generation of or distribution of syndrome bits generated during the error correction. This way, the aggregate propagation delay associated with sending flip bits to the data component after syndrome bits corresponding to inversion bits for all of the codewords in a memory section have propagated across the memory section may be avoided.

That said, refraining from performing error correction on the inversion bit may, in some examples, reduce the reliability of the flip bit. Accordingly, sending the flip bit directly to a bit flipping component may reduce the reliability of the memory system.

In some cases, alternative error correction techniques (e.g., using a repetition code) than those used to error correct data bits of a codeword (e.g., using a Hamming code) may be used to increase the reliability of a flip bit for a codeword. This way, the reliability of the flip bit, and by extension a memory device, may be maintained at or above a reliability level obtained by error correcting the flip bit using the same error correction scheme that is used for the data bits. Also, the alternative error correction techniques may be performed while the other error correction technique is being performed for the data bits, mitigating the aggregate propagation delay associated with waiting to send flip bits of a memory section to a bit flipping component until after the corresponding syndrome bits have been distributed across the memory section.

In some examples, the reliability of a flip bit may be increased using an alternative error correction technique by including multiple inversion bits in a codeword. For example, three or more inversion bits may be included in a codeword and used to "vote" on a value of the flip bit (which may also be referred to as a repetition scheme). That is, the flip bit may be generated based on determining whether a majority of the inversion bits indicate that the data bits in the codeword have been inverted. This way, the probability of the flip bit failing may be a function of the number of inversion bits included in the codeword and the RBER of the inversion bits. For example, for such a voting scheme that uses three inversion bits, the UBER of the flip bit may be 3-choose-2 times the square of the RBER of a single inversion $$\text{bit—e.g., } \binom{3}{2} * RBER_{inv}^2 .$$

Also, the voting may be completed without reference to the data bits, and thus, before or while syndrome bits for the data bits are being generated and/or distributed throughout a memory section.

In another example, the reliability of a flip bit may be increased without error correction by using multiple inversion bits and a more robust sensing scheme. For example, two inversion bits stored in two memory cells may be read using a differential sensing scheme. And before processing a codeword, the two memory cells may be sensed to generate a single, high-reliability inversion bit, which may then be used as or to generate a flip bit. In some cases, the RBER of a flip bit generated for a codeword based on a differential sensing scheme may be equal to or higher than the UBER of the data bits for the codeword.

In some examples, the reliability of a flip bit may be increased without error correction by using a single inversion bit per codeword and a more robust storage scheme for the inversion bit—e.g., by increasing a reliability of the inversion bit. For example, the inversion bit may be stored in a memory cell having a larger sensing window—e.g., due to a chemical composition of the memory cell, a size of the memory cell, a technology used for the memory cell. And when processing a codeword, the memory cell may be sensed to generate a high-reliability inversion bit, which may then be used as or to generate a flip bit. In some cases, the RBER of a flip bit generated for a codeword based on an inversion bit stored in a robust storage scheme may equal to or higher than the UBER of the data bits for the codeword. In some examples, the techniques for increasing the reliability of a flip bit may be extended to other control bits such as error correction, or redundant bits, or both, among other examples.

Features of the disclosure introduced above are further described herein in the context of a memory system. Specific examples of devices and methods for reading a codeword according to an enhanced bit flipping scheme are then described. These and other features of the disclosure are further illustrated by and described with reference to apparatus diagrams, system diagrams, and flowcharts that relate to an enhanced bit flipping scheme.

FIG. 1 illustrates an example memory array that supports an enhanced bit flipping scheme in accordance with various embodiments of the present disclosure. Memory array 100 may be used to store digital information (e.g., binary information) and may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states.

A memory cell 105 may include a memory element having programmable states. A memory cell 105 in a DRAM or FeRAM architecture may store a charge representative of the programmable states in a capacitor; for example, a charged and uncharged capacitor may represent two logic states, respectively. DRAM architectures may commonly use such a design and may use a capacitor including a dielectric material and having linear electric polarization properties as a memory element. FeRAM architectures may also use such a design, but the capacitor used as the memory element may include a ferroelectric material with non-linear polarization properties. A memory cell 105 in a PCM or segregation based memory (SBM) architecture may change a resistivity (e.g., resistance or threshold voltage) of a material where different resistivity may represent different logic states. PCM and/or SBM architectures may use chalcogenide materials having electronically programmable resistances as memory elements. In some cases, a memory cell 105 in a PCM architecture is programmed by changing a phase of a memory material. In some cases, a memory cell 105 in an SBM architecture is programmed by causing ion movement within a memory material.

Operations such as reading and writing may be performed on memory cells 105 by activating or selecting the appropriate access line 110 and digit line 115. Access lines 110 may also be referred to as word lines 110 and digit lines 115 may also be referred to as bit lines 115. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell (e.g., a capacitor) may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_3 and DL_N, the memory cell 105 at their intersection may be accessed.

Upon accessing, a memory cell 105 may be read, or sensed, by sense component 125 to determine the stored state of the memory cell 105. For example, after accessing the memory cell 105, the capacitor of memory cell 105 may discharge onto its corresponding digit line 115. Discharging the capacitor may be based on biasing, or applying a voltage, to the capacitor. The discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa.

The reliability of a sensing operation may be dependent on a sensing window that results from reading the memory cell 105. For instance, a larger sensing window may be associated with fewer bit errors than a smaller sensing window. The sensing window may be determined as the difference between a voltage of a digit line 115 resulting from reading a memory cell 105 when storing a logic 1 and a the voltage of the digit line 115 resulting from reading the memory cell when storing a logic 0. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by activating the relevant word line 110 and digit line 115. As discussed herein, activating a word line 110 electrically connects the corresponding row of memory cells 105 to their respective digit lines 115. By controlling the relevant digit line 115 while the word line 110 is activated, a memory cell 105 may be written—e.g., a logic value may be stored in the memory cell 105. Column decoder 130 may accept data, for example input 135, to be written to the memory cells 105.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some cases, memory array 100 may flip a logic state of a memory cell 105—e.g., change a logic value stored in memory cell 105 from one value (e.g., logic 1) to another logic value (logic 0). Memory array 100 may perform the flipping internally and may not inform other external devices or components that the logic state of a memory cell has been flipped. Memory array 100 may flip memory cells to save power, to increase the reliability of a device, or the like. For example, for FeRAM, ferroelectric memory cells may be flipped to mitigate the effects of imprinting—e.g., the drifting of ferroelectric domains due to extended exposure to or storage of the same charge—which may reduce the reliability of the memory cell over time. A memory cell 105 storing a logic state that is different than the original logic state—e.g., the logic state expected to be stored at the memory cell by external devices or components—may be referred to as being in an inverted state.

In some cases, memory array 100 is partitioned into sets of memory cells. For example, memory array 100 may be partitioned into memory sections which may include thousands of memory cells 105. A memory section may be further partitioned into codewords which may include hundreds of memory cells 105. And a codeword may be partitioned into memory units which may include a single-digit number of memory cells 105—e.g., a memory unit may include four memory cells 105.

In some examples, information stored in memory array 100 may be requested by another device (e.g., a memory component such as a buffer or an external processor). Memory array 100 may identify a location of the information within memory array 100. In some cases, memory array 100 may determine that the information is located within a codeword that is located within a particular section of memory. In some examples, memory array 100 may access the entire memory section based on identifying that the memory section includes the codeword and may provide all of the information stored in the memory section to the requesting device.

However, before providing the information stored in the memory section to the requesting device, memory array 100 may first process the information, performing redundancy repair and error correction for the information bits stored in the memory section. Memory array 100 may also determine whether any of the codewords in the memory section are in an inverted state and flip the bits of the codeword to return the data bits to the stored state expected by the requesting device.

During error correction, memory array 100 may generate syndrome bits which may be used to indicate whether certain memory cells are storing corrupted data and the data stored in corrupted memory cells may be flipped to the correct value. In some cases, no errors may be identified during error correction and all of the generated syndrome bits have a logic value 0. In some cases, the delivery of the syndrome bits throughout a memory section may be associated with a propagation delay—e.g., due to the physical size of the memory section and/or serial data delivery. To flip the bits of the codeword, an inversion/flip bit for the codeword may be provided to a bit flipping component, which may flip the data bits of the codeword (e.g., if the inversion bit indicates that the data bits are in an inverted state). In some cases, the inversion bit may be the same as or used to generate a flip bit.

In some cases, memory array 100 may perform error correction for an entire codeword including a corresponding inversion bit. Thus, memory array 100 may wait to provide a flip bit to a bit flipping component until after the syndrome bits have been received. However, waiting to send the flip bit until after receiving the syndrome bits may increase the latency of the memory system. Also, the latency may be further increased while the flip bits are provided are delivered throughout the memory section—e.g., since the information stored in a memory section may not be provided to the requesting device until after the entire section has been completely processed.

Memory array 100 may refrain from performing error correction on an inversion bit for a codeword and may provide a flip bit to a bit flipping component concurrent with (i.e., at least partially overlapping with) the error correction. In some examples, memory array 100 may include multiple inversion bits in a codeword and may generate a flip bit based on a value stored by the inversion bits.

Memory array 100 may also perform an error correction of data bits of the codeword using one error correction technique (e.g., using a Hamming code) concurrently with an error correction/generation of the flip bit using a different error correction technique (e.g., using a repetition code). In some cases, the generation/error correction of the flip bit may overlap with the generation or distribution of syndrome bits—e.g., the transmission of all of the syndrome bits to different locations of a memory section—during the error correction of the data bits. After error correcting/generating the flip bit, memory array 100 may communicate (e.g., transmit, send, provide, etc.) the flip bit to a bit flipping component where the data bits may be flipped based on a value of the flip bit. This way, latency may be reduced and the effect of aggregate propagation delays may be mitigated for memory array 100.

In some cases, memory array 100 may generate/error correct the flip bit using a voting scheme and multiple inversion bits. A voting scheme may be a type of error correction scheme. For example, memory array 100 may determine for a codeword including multiple inversion bits whether a majority of the inversion bits indicates that data bits in the codeword are in an inverted state. Memory array 100 may generate a flip bit based on determining whether at least some of (e.g., a majority or all of) the data bits indicate that the codeword is in an inverted state—e.g., memory array 100 may generate a flip bit indicating that the data bits are to be flipped if a majority of the data bits indicate that the codeword is in an inverted state. Memory array 100 may then transmit the flip bit to a bit flipping component. A reliability of the flip bit may be increased using a different error correction scheme for the inversion bits than for the data bits of a codeword. In some cases, the flip bit output by the voting scheme may be generated and/or provided to a bit flipping component concurrently with the generation and/or distributing of the syndrome bits during the error correction of the data bits for the codeword.

In some cases, memory array 100 may store two inversion bits for a codeword using a differential sensing scheme to generate the flip bit for the codeword. The differential sensing scheme may be used to generate a single inversion bit that has a higher reliability than the individual inversion bits and the corrected information bits in memory array 100. The single inversion bit may then be used as or used to generate the flip bit. Such a scheme may increase the reliability of the flip bit without error correcting the inversion/flip bits and may be used to provide the flip bit to a bit flipping component concurrently with the generation and/or distribution of syndrome bits.

In some cases, memory array 100 may store a single inversion bit for a codeword in a memory cell having a larger sensing window than other memory cells in memory array 100. For example, the inversion bit may be stored in a memory cell having a larger size than other memory cells in memory array 100, that uses a different technology than other memory cells in the memory array, and the like. The single inversion bit may have a higher reliability than the corrected information bits in memory array 100 and may be used as or used to generate the flip bit. Such a scheme may increase the reliability of the flip bit without error correcting the inversion/flip bit and may provide the flip bit to a bit flipping component concurrently with the generation and/or distribution of syndrome bits.

Figure 2:
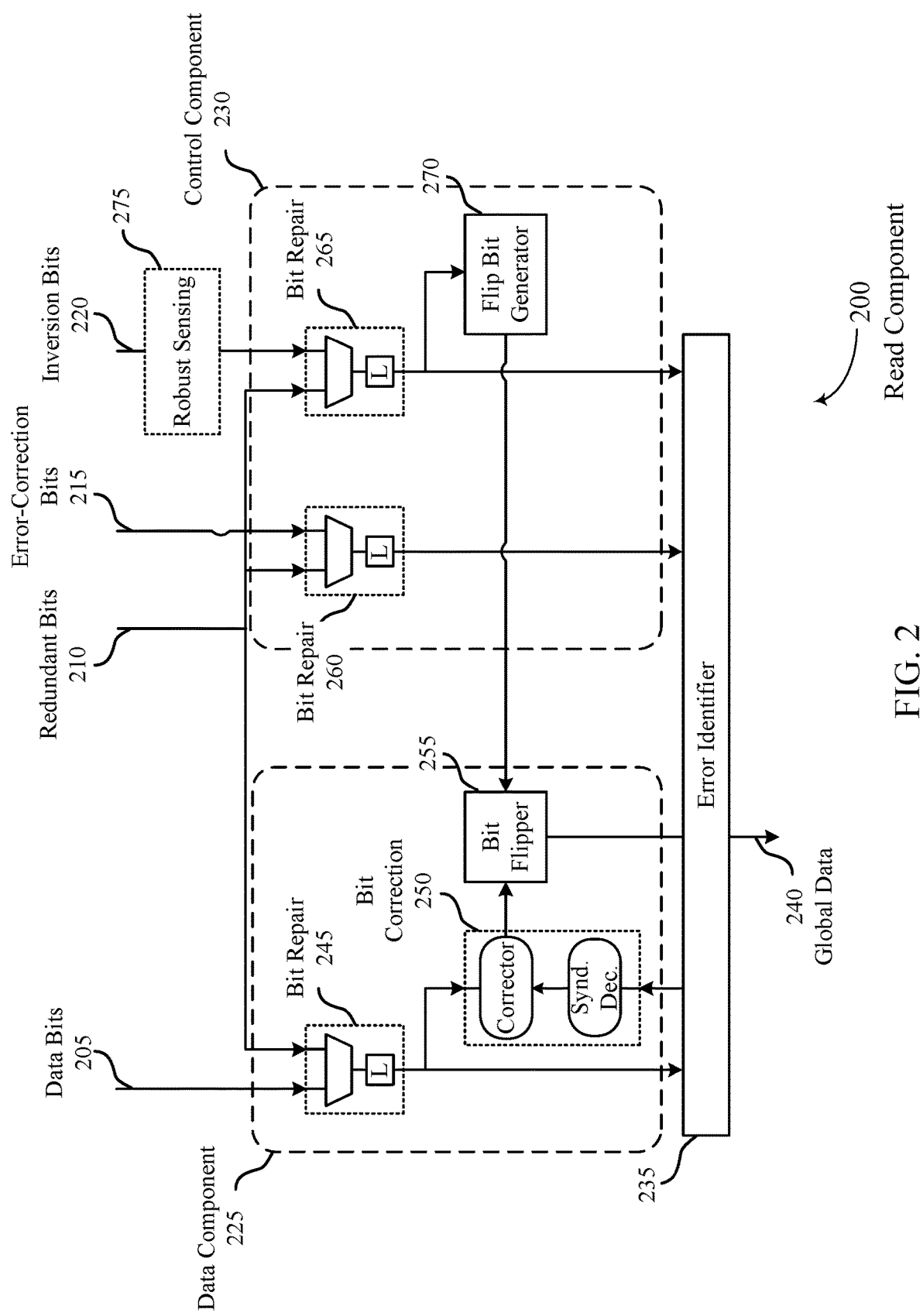
FIG. 2 illustrates an example read component that supports an enhanced bit flipping scheme in accordance with various aspects of the present disclosure.

FIG. 2 illustrates an example read component that supports an enhanced bit flipping scheme in accordance with various aspects of the present disclosure. Read component 200 may be used to process information stored in a memory array. Read component 200 may include input lines (data bit line 205, redundant bit line 210, error correction bit line 215, and inversion bit line 220), data component 225, control component 230, error identification component 235, an output line (global data line 240), and robust sensing component 275.

Data bit line 205 may be configured to communicate data bits for one or more codewords between memory cells storing data and data component 225. Data bits may represent data for a user application. Redundant bit line 210 may be used to communicate redundant bits between memory cells storing redundant data bits and data component 225 and between memory cells storing redundant data control bits and control component 230. Redundant bits may correspond to and be used to replace certain data and/or control bits. In some cases, redundant bits are stored in memory cells having higher reliability than other memory cells.

Error correction bit line 215 may be used to communicate error correction bits, such as parity bits, between memory cells storing error correction bits and control component 230. Error correction bits may be used to identify errors in data and/or control bits. Inversion bit line 220 may be used to communicate inversion bits indicating whether the data bits are in an inverted state between memory cells storing inversion bits and control component 230. Inversion bits for a codeword may be used to indicate whether corresponding data and/or control bits for a codeword are in an original/expected state or an inverted state.

Data component 225 may be configured to process data bits stored in one or more codewords and to deliver processed data bits to a requesting device. Data component 225 may receive data bits from data bit line 205. Data component 225 may include first bit repair component 245, bit correction component 250, and bit flipping component 255.

First bit repair component 245 may be configured to replace particular data bits with corresponding redundant data bits. First bit repair component 245 may receive data bits from data bit line 205 and redundant data bits from redundant bit line 210. First bit repair component 245 may replace particular data bits of the received data bits with particular redundant data bits of the received redundant bits during a process that may be referred to as redundancy repair. First bit repair component 245 may include a first multiplexer configured to replace a subset of data bits and a latch for storing the redundancy repaired data bits. An output of the first multiplexer may be coupled with bit correction component 250 and/or error identification component 235. First bit repair component 245 may transmit the redundancy repaired data bits to bit correction component 250 and/or error identification component 235.

Bit correction component 250 may be configured to correct data bits that have been identified as being corrupted. Bit correction component 250 may include a component for correcting corrupted bits and a component for processing syndrome bits, such as a syndrome decoder. Bit correction component 250 may receive data bits (e.g., redundancy repaired data bits) from first bit repair component 245.

Bit correction component 250 may also receive syndrome bits from error identification component 235. The syndrome bits may identify data bits of the redundancy repaired data bits that have failed (e.g., been corrupted). Bit correction component 250 may then correct the errors in the data bits identified by the syndrome bits. In some cases, bit correction component 250 identifies particular data bits that have been identified as failed (e.g., corrupted) based on the syndrome bits and flips a logic value of the data bit (e.g., using XOR circuitry). In some cases, bit correction component 250 determines that none of the data bits are corrupted based on the syndrome bits—e.g., when the syndrome bits are all logic 0s. After processing the syndrome bits, bit correction component 250 may transmit the corrected data bits to bit flipping component 255.

Bit flipping component 255 may be configured to flip the corrected data bits from an inverted state to an original state based on a received flip bit. Bit flipping component 255 may receive the corrected data bits from bit correction component 250. Bit flipping component 255 may also receive a flip bit from flip bit generator 270. Bit flipping component 255 may flip the corrected data bits from an inverted state based on a value of the flip bit. For example, if a value of the flip bit is a logic 1, the bit flipper may flip the corrected data bits. Flipping the corrected data bits may include transmitting the corrected data bits through an XOR component that causes a value of the data bits to change to an opposite value (e.g., from a logic 0 to a logic 1).

If the data bits stored in the memory cells were flipped (e.g., placed in an inverted state for reliability reasons) before being provided to data component 225, then bit flipping component 255 may flip the corrected data bits based on receiving a flip bit that triggers bit flipping component 255 to flip the corrected data bits. If the data bits stored in the memory cells were not flipped before being provided to data component 225, then bit flipping component 255 may refrain from flipping the corrected data bits based on receiving a flip bit that does not trigger bit flipping component 255 to flip the corrected data bits. In some cases, bit flipping component may be configured to flip the data bits after errors in the data bits have been corrected. In some cases, bit flipping component 255 may improperly flip or fail to flip corrected data bits if the flip bit is corrupted. Bit flipping component 255 may generate global data bits—which may be used to refer to data bits that have been fully by processed by read component 200 and that are provided to a requesting device—and may transmit the global data bits to a requesting device via global data line 240.

Control component 230 may be configured to process control bits stored in one or more codewords and to assist data component 225 in the processing of data bits for one or more codewords. Control component 230 may include second bit repair component 260, third bit repair component 265, and flip bit generator 270.

Second bit repair component 260 may be configured to replace particular error correction bits with corresponding redundant error correction bits similar to first bit repair component 245. Second bit repair component 260 may receive error correction bits from error correction bit line 215 and redundant error correction bits from redundant bit line 210. In some case, second bit repair component 260 may not receive any redundant error correction bits on redundant bit line 210. Second bit repair component 260 may include a second multiplexer configured to replace a subset of the error correction bits and a latch for storing the redundancy repaired error correction bits. Second bit repair component 260 may transmit the redundancy repaired error correction bits to error identification component 235.

Third bit repair component 265 may be configured to replace particular inversion bit(s) with corresponding redundant inversion bits similar to first bit repair component 245 and second bit repair component 260. Third bit repair component 265 may receive inversion bit(s) from inversion bit line 220 and redundant inversion bit(s) from redundant bit line 210. In some case, third bit repair component 265 may not receive any redundant inversion bits on redundant bit line 210. Third bit repair component 265 may include a third multiplexer configured to replace a subset of the inversion bit(s) and a latch for storing the redundancy repaired inversion bit(s). Third bit repair component 265 may transmit the redundancy repaired inversion bit(s) to error identification component 235. In some cases, third bit repair component 265 receives multiple inversion bits via inversion bit line 220 and transmits multiple redundancy repaired inversion bits to flip bit generator 270. In some cases, the second and third multiplexers may be implemented as a single multiplexer configured to replace a subset of the control bits.

Flip bit generator 270 may be configured to determine whether the data bits are in an inverted state and to generate a flip bit for a codeword indicating whether data bits of the codeword should be flipped from an inverted state back to an original/expected state before being provided to a requesting device. Flip bit generator 270 may generate the flip bit based on the redundancy repaired inversion bit(s) received from bit repair component 265. In some cases, flip bit generator 270 may implement an alternative error correction technique (e.g., using a repetition code, such as a voting scheme) different than the error correction technique implemented by error identification component 235.

For example, when multiple inversion bits are used for a codeword, flip bit generator 270 may include a voting component, which may be used to determine whether at least some of (e.g., a majority or all of) the inversion bits indicate that the corresponding data bits in the codeword are in an inverted state or, alternatively, the inversion bits indicate that the corresponding data bits in the codeword are not in an inverted state.

For example, if the majority of the inversion bits indicate that the corresponding data bits are in an inverted state, flip bit generator 270 may generate a flip bit that triggers bit flipping component 255 to flip the corrected data bits. Otherwise, if the majority of the inversion bits indicate that the corresponding data bits are not in an inverted state (e.g., are in a non-inverted, originally stored state), flip bit generator 270 may generate a flip bit that directs bit flipping component 255 to refrain from flipping the corrected data bits. In some cases, the voting component may determine whether a majority of inversion bits indicate that corresponding data bits are in an inverted state concurrent with the identification of errors in the data bits by error identification component 235. The voting component may be electrically isolated from error identification component 235. The voting component is discussed in more detail herein and at least with reference to FIGS. 6 and 7.

Additionally or alternatively, when multiple inversion bits are used for a codeword, robust sensing component 275 may be used to generate a single, high reliability inversion/flip bit from multiple inversion bits of a codeword before the codeword is processed using data component 225 or control component 230 and without employing error correction techniques for the inversion bits. For example, robust sensing component 275 may be a differential sensing component. In such cases, two inversion bits of a codeword stored in two memory cells may be sensed together using robust sensing component 275 to generate a single high-reliability inversion bit—e.g., an inversion bit having an RBER that is greater than or equal to a UBER of information bits in the memory system. The differential sensing component is discussed in more detail herein and at least with reference to FIG. 5. The high reliability inversion bit may then be provided to third bit repair component 265. When robust sensing component 275 is used, flip bit generator 270 may include a switch or a wire that routes the high reliability inversion bit to bit flipping component 255—e.g., the generated high reliability inversion bit may be used as the flip bit.

When a single inversion bit is used for a codeword, a more robust memory cell may be used to generate a single, high reliability inversion/flip bit before the codeword is processed using data component 225 or control component 230 and without employing error correction techniques for the inversion bit. In some cases, the single inversion bit is stored in a robust memory cell having a lower likelihood of producing erroneous data (e.g., an RBER<=1e−18) than other memory cells in a memory array. For example, the memory cell may be constructed to have a larger sensing window than other memory cells, may use a different memory technology (e.g., DRAM instead of FeRAM), and the like. When a single memory cell (e.g., a robust memory cell) is used to store an inversion bit for a codeword, the flip bit and the inversion bit may be the same and flip bit generator 270 may include a switch or a wire that routes the inversion/flip bit to bit flipping component 255—e.g., the inversion bit may be used as the flip bit in some cases.

Flip bit generator 270 may transmit a generated flip bit to bit flipping component 255. The flip bit may be transmitted to bit flipping component 255 while error identification component 235 generates and/or transmits syndrome bits—e.g., bit flipping component 255 may transmit the flip bit to the bit flipping component 255 before or while the syndrome bits are transmitted to bit correction component 250. In some cases, flip bit generator 270 may be electronically isolated from error identification component 235 via bit flipping component 255. That is, an output of error identification component 235 may not affect an output of flip bit generator 270—or the generation of the flip bit may be performed independently of, or without reference to, the generation of the syndrome bits.

Error identification component 235 may be configured to identify errors in data bits received from first bit repair component 245. In some cases, error identification component 235 may identify errors in the data bits based on error correction bits received from bit repair component 260 (e.g., using a Hamming code). Error identification component 235 may generate syndrome bits based on the data and error correction bits and may transmit the syndrome bits to bit correction component 250. Error identification component 235 may transmit the syndrome bits to bit correction component 250 in a serial or parallel fashion. Providing the syndrome bits for an entire memory section to bit correction component 250 may be associated with propagation delays.

Global data line 240 may be configured to transmit data bits that have been processed through read component 200 ("global data bits") to a requesting device.

In some cases, first bit repair component 245, bit correction component 250, bit flipping component 255, second bit repair component 260, bit repair component 265, and flip bit generator 270 may each be implemented as a single component for an entire memory section. In other cases, first bit repair component 245, bit correction component 250, bit flipping component 255, second bit repair component 260, bit repair component 265, and flip bit generator 270 may each be implemented as multiple component for each codeword of an entire memory section. For example, read component 200 including multiple memory sections may include one or more first bit repair components 245, one or more bit correction components 250, one or more bit flipping components 255, one or more second bit repair components 260, one or more bit repair components 265, and one or more flip bit generators 270.

Figure 3:
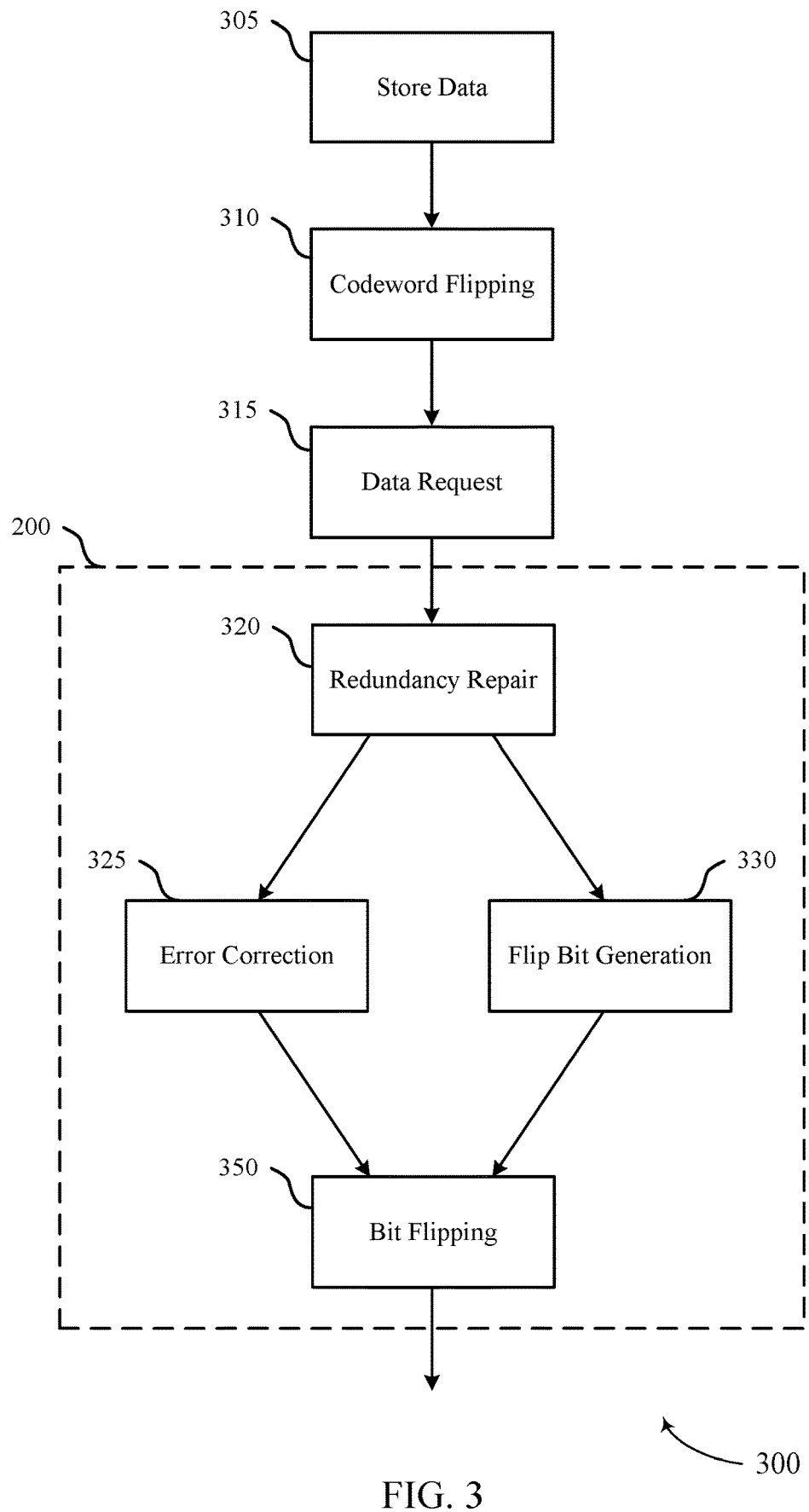
FIG. 3 illustrates aspects of an example memory operation using an enhanced bit flipping scheme in accordance with various aspects of the present disclosure.

FIG. 3 illustrates aspects of an example memory operation using an enhanced bit flipping scheme in accordance with various aspects of the present disclosure. Flowchart 300 illustrates aspects of operating one or more memory components, such as read component 200 of FIG. 2, as one example, in accordance with an enhanced bit flipping scheme.

As described herein, performing error correction for inversion bit(s) of a codeword that is dependent on data bits of the codeword may introduce latency into a memory system. Also, this latency may be compounded when reading information from an entire memory section due to propagation delays. To reduce this latency, a memory system may refrain from performing error correction for the inversion bit(s) of a codeword and may generate the flip bit in parallel with the error correction of data bits of the codeword. Examples for reducing latency may be discussed in the context of flowchart 300.

At block 305, a memory system may store information bits in a memory array, for example, for a user application. Storing information bits may include storing data bits and corresponding control bits in codewords of one or more memory sections. In some cases, control bits may include redundant bits, error correction bits (e.g., parity bits), and/or inversion bits.

At block 310, a memory system may flip the information bits of one or more codewords of a memory section—e.g., for reliability reasons. Flipping the data bits may include flipping the data and control bits from originally stored values (e.g., the value stored at block 305) to different values (e.g., opposite values—a logic 0 to a logic 1) or flipping the data and control bits from a different value back to an originally stored value. Data and control bits that have been flipped to store opposite values may be referred to as being in an inverted state. After flipping the information bits, the memory system may set one or more inversion bits for the codeword that indicate whether the data and/or control bits of a codeword are in an inverted state.

For example, an inversion bit for a codeword having logic value 1 may indicate that the codeword is in an inverted state and an inversion bit for a codeword having logic value 0 may indicate that the codeword in an original/expected state. In some cases, the flipping may be performed internal to the memory system, and thus, user application and other memory components may not be aware that the information stored in a codeword has been changed from what was originally stored. Accordingly, the memory system may either indicate, to a requesting device, which transmitted data has been inverted or return the inverted information bits to their original state before delivering the information stored in a codeword to a requesting device.

At block 315, the memory system may receive a request for data stored in the one or more codewords—e.g., from a user application or another memory component. In response to the data request, the memory system may access the entire memory section. That is, the memory system may sense the logic states stored in each memory cell in the memory section. The sensed logic states may then be transmitted as corresponding information bits to read component 200 which may process the information bits. The information bits may include data and control bits for one or more codewords. As discussed herein, read component 200 may separately process data and control bits for each codeword of the memory section. Blocks 320 to 350 illustrate aspects of such codeword processing.

At block 320, read component 200 may replace particular data and control bits with redundant bits (e.g., at first bit repair component 245, second bit repair component 260, and third bit repair component 265) for each codeword during a process referred to as redundancy repair. The repaired data bits may be transmitted to error correction circuitry such as error identification component 235 and bit correction component 250. The repaired control bits may be transmitted to error identification component 235 and flip bit generator 270. In some cases, a duration of the redundancy repair includes the time during which the redundant bits propagate across the memory section.

At block 325, error identification component 235 may perform an error correction for each codeword. During the error correction, error identification component 235 may generate syndrome bits for the data bits of the codeword identifying which data bits (if any) are corrupted. In some cases, the syndrome bits are generated based on the data bits, the error correction bits, and/or the inversion bit(s) of a codeword. Bit correction component 250 may receive the syndrome bits and correct any data bits that have been identified as corrupted—e.g., by flipping the logic value of an identified data bit.

After generating the syndrome bits for each codeword, error identification component 235 may send the syndrome bits to data component 225. Sending the syndrome bits for each codeword of a memory section may be slowed by propagation delays (e.g., due to the physical size of a memory section) and processing delays (e.g., particularly if the syndrome bits are processed serially). Read component 200 may refrain from generating syndrome bits for the inversion bit(s) of the codeword to avoid introducing propagation delays incurred while distributing the syndrome bits for each codeword to the control component 230. In some cases, the syndrome bits may be generated for data bits of a codeword while or after generating a flip bit for the codeword. In some cases, error identification component 235 may transmit the syndrome bits to bit correction component 250 after a flip bit is transmitted to bit flipping component 255.

At block 330, flip bit generator 270 may generate flip bits for each codeword based on a value of the inversion bit(s) of each codeword. In some cases, the generation of flip bits and aspects of the error correction discussed at block 325 are performed concurrently. For example, flip bit(s) may be generated concurrently with the syndrome bits or while the syndrome bits are being delivered to data component 225. Flip bit generator 270 may transmit the flip bit(s) for each codeword to bit flipping component 255. In some cases, the flip bit(s) may be transmitted to bit flipping component 255 before at least a portion of the syndrome bits have been delivered to bit correction component 250. In some cases, the flip bit(s) may be transmitted to bit flipping component 255 before at least a portion of the corrected data bits are transmitted to the bit flipping component 255 from bit correction component 250. This way, the propagation delay incurred by transmitting the syndrome bits may be mitigated and the processing speed for data bits may be increased—e.g., the total processing time for blocks 320 to 350 may be decreased from 5 ns to 4 ns.

At block 350, bit flipping component 255 may receive the corrected data bits and flip bit(s) for one or more codewords and may flip the values of corrected data bits for a codeword based on the value of a corresponding flip bit. For example, bit flipping component 255 may receive corrected data bits and a flip bit for a codeword indicating that the data bits stored in the codeword are in an inverted state—e.g., based on determining that a value of the flip bit is a logic 1.

In some cases, the flip bit may indicate that the data bits are in an inverted state based on flip bit generator 270 determining that at least some of (e.g., a majority or all of) the inversion bits for the codeword indicate that the data bits are in an inverted state. Accordingly, bit flipping component 255 may flip the corrected data bits to return the data bits to their originally stored values. Bit flipping component 255 may then transmit the flipped data bits (or "global data bits") to a requesting device, such as a memory buffer.

Alternatively, bit flipping component 255 may receive corrected data bits and a flip bit for a codeword indicating that the data bits stored in the codeword are in an original state—e.g., based on determining that a value of the flip bit is a logic 0. In some cases, the flip bit indicates that the data bits are not in an inverted state based on flip bit generator 270 determining that a number (e.g., a minority) of inversion bits for the codeword indicate that the data bits are in an inverted state. Accordingly, bit flipping component 255 may transmit the corrected data bits directly to a requesting device without flipping the corrected data bits.

As discussed herein, using a flip bit that has not been error corrected may result in an unintended flipping operation—e.g., due to using a corrupted inversion bit to generate the flip bit. To increase the reliability of a flip bit while still reducing latency, a memory system may employ alternative error correction techniques and/or techniques other than error correction. Examples for increasing the reliability may be discussed in the context of block 350.

When multiple inversion bits are used for a codeword, flip bit generator 270 may perform alternative error correction of the inversion bit by employing a voting circuit, as discussed in more detail with reference to FIGS. 6 and 7, to determine whether a majority of the inversion bits indicate that the information of the codeword is in an inverted state. For instance, flip bit generator 270 may determine that data bits of a codeword are in an inverted state by determining that a majority of the inversion bits of the codeword indicates that the data bits are in an inverted state by comparing a value stored by each of the inversion bits. Or flip bit generator 270 may determine that data bits of a codeword are in an original state by determining that a minority of the inversion bits of the codeword indicates that the data bits are in an inverted state by comparing a value stored by each of the inversion bits. Generating a flip bit using multiple inversion bits may increase the UBER of the flip bit as a function of the number of inversion bits used.

In some examples, a first error rate associated with a flip bit for a codeword may be equal to or greater than a second error rate associated with data bits of the codeword. For example, a UBER of a flip bit for a codeword generated using a voting scheme may be equal to or greater than a UBER of a data bit of the codeword. For instance, for a codeword including three inversion bits, the UBER of the flip bit may be 3-choose-2 times the $RBER^2$ of an individual information bit stored in the memory system—e.g., the RBER of a single uncorrected information bit may be 1e−10 and the UBER of a flip bit may be 3e−20.

Additionally or alternatively, when multiple inversion bits are used for a codeword, read component 200 may employ a robust sensing scheme to generate a single high-reliability inversion bit, which may be used as the flip bit, without performing error correction of the inversion bits. The reliability of the inversion bit generated by the robust sensing scheme (e.g., the RBER of the inversion bit) may be higher than the reliability of error corrected information bits in the memory device (e.g., the UBER of the error corrected information bits). The robust sensing scheme is discussed in more detail with reference to FIG. 5.

When a single inversion bit is used for a codeword, read component 200 may store the single inversion bit in a robust memory cell and use the single high-reliability inversion bit as the flip bit without performing error correction of the inversion bit. In some cases, a reliability of the inversion bit (e.g., the RBER of the inversion bit) may be higher than a reliability of error corrected information bits in the memory device (e.g., the UBER of the error corrected information bits). Each of the above techniques may be used to generate a flip bit having a reliability that is on par with or better than generating the flip bit using error correction techniques.

When a single inversion bit is used per codeword, generating a flip bit for a codeword may include copying a value of the inversion bit or transmitting the inversion bit through flip bit generator 270. When multiple inversion bits are used per codeword, generating a flip bit for a codeword may include calculating a value of the flip bit based on values of the multiple inversion bits. Alternatively, when multiple inversion bits are used per codeword to generate a single high-reliability inversion bit, generating a flip bit for a codeword may include copying a value of the inversion bit or transmitting the inversion bit through flip bit generator 270.

In some cases, the memory system may both perform error correction for the data bit concurrently with the generation of flip bit(s) and use alternative error correction/other techniques to increase the reliability of the flip bit(s). This way, the reliability of memory device may advantageously be maintained while also increasing the throughput of the memory device.

Figure 4:
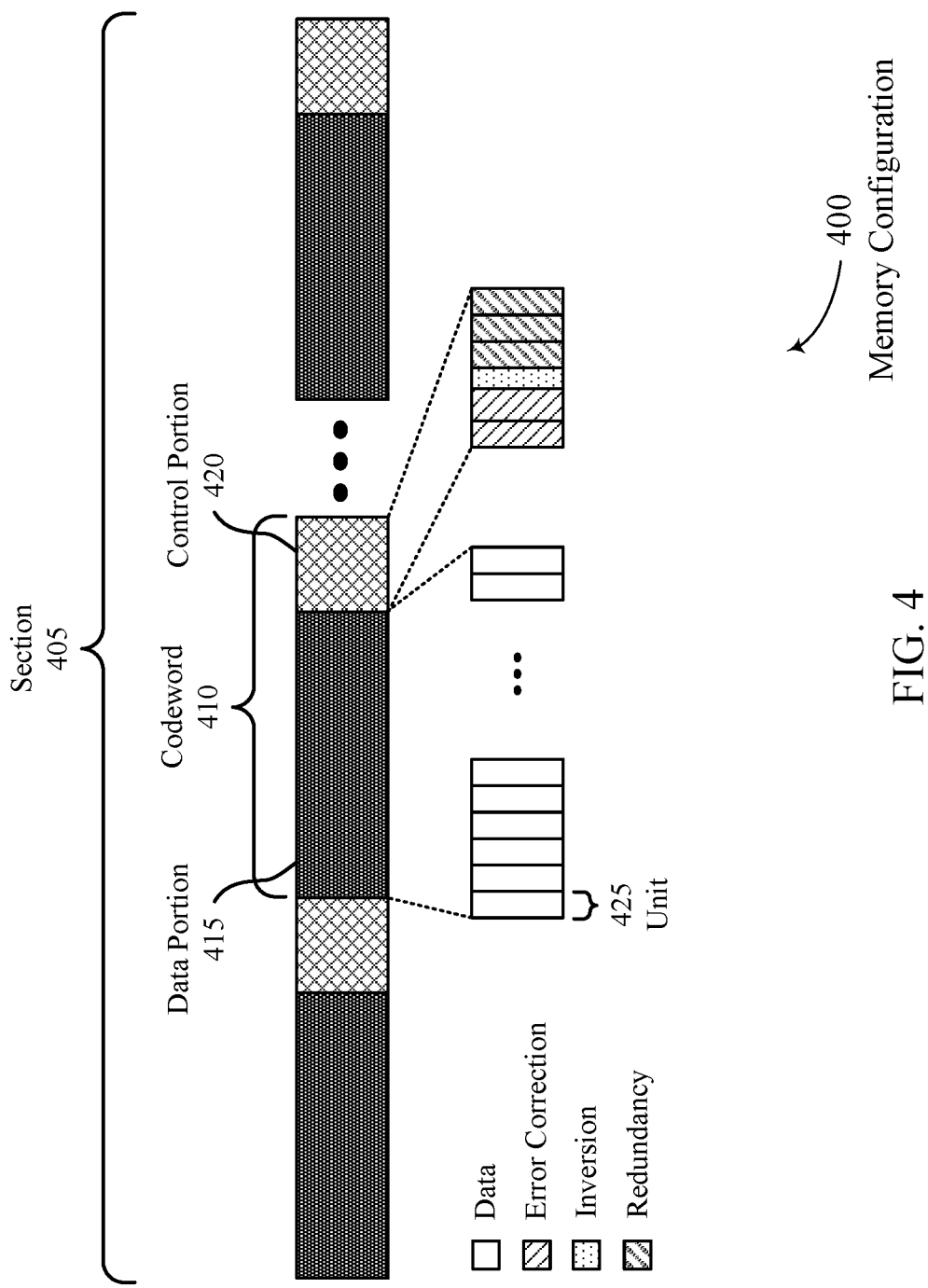
FIG. 4 illustrates an example memory configuration for an enhanced bit flipping scheme in accordance with various aspects of the present disclosure.

FIG. 4 illustrates an example memory configuration for an enhanced bit flipping scheme in accordance with various aspects of the present disclosure. Memory configuration 400 may be used to store digital information. Memory configuration 400 may include memory sections, such as memory section 405, codewords, such as codeword 410, and memory units, such as memory unit 425.

Memory section 405 may encompass information stored in hundreds or thousands of memory cells. In some cases, the memory cells may span across large physical distances (e.g., ~1 mm). In some cases, memory section 405 corresponds to a page of memory (e.g., 1024 bits) and includes multiple codewords (e.g., 8 codewords), including codeword 410.

Codeword 410 may encompass hundreds of memory cells. In some cases, codeword 410 corresponds to a prefetch size (e.g., 128 bits) and includes data portion 415 and control portion 420. Data portion 415 may store data bits, such as application data. Control portion 420 may store control bits, such as redundant bits, error correction bits, and inversion bits. The control bits may be used to facilitate the processing and to increase the reliability of the data bits stored in data portion 415. Data portion 415 and control portion 420 may be further partitioned into memory units. Memory units, such as memory unit 425, may encompass a few memory cells (e.g., 2, 4, or 8). In some cases, memory unit 425 may correspond to a number of bits.

In some cases, the all of memory section 405 is accessed when data stored in codeword 410 is requested by another device. In some cases, accessing all of memory section 405 results in propagation delays during memory operations— e.g., due to the large physical distance of the memory cell in memory section 405.

As discussed herein, these propagation delays may be compounded when processing steps of an operation are performed serially, and to reduce propagation delays, a memory system may perform certain steps, such as flip bit generation and error correction of data bit for a codeword, in parallel.

As also discussed herein, to increase the reliability of a generated flip bit using an alternative error correction technique, the memory system may utilize multiple inversion bits per codeword. In some examples, the multiple inversion bits may be stored in control portion 420. For example, three inversion bits may be stored in control portion 420 along with nine error correction bits and twelve redundant bits. In another example, two inversion bits may be stored in control portion 420 along with nine error correction bits, twelve redundant bits, and one unused bit.

Figure 5:
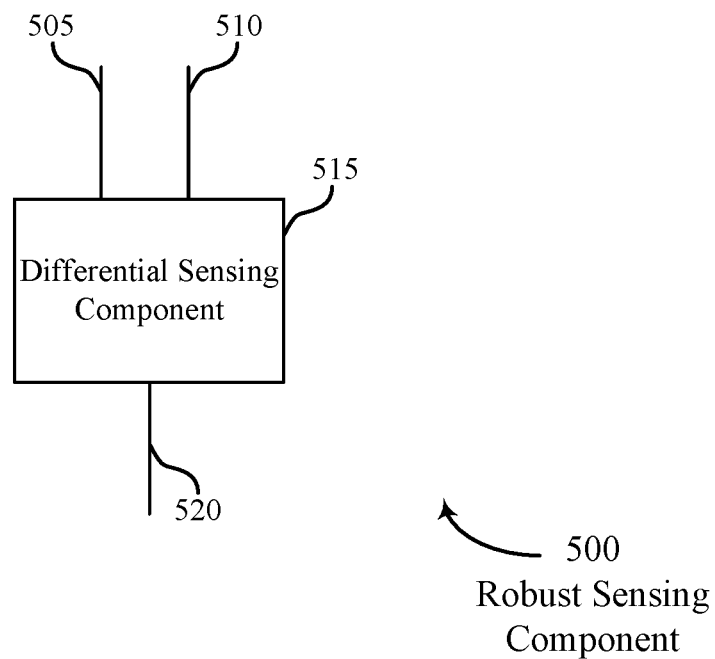
FIG. 5 illustrates an example flip bit generator for an enhanced bit flipping scheme in accordance with various aspects of the present disclosure.

FIG. 5 illustrates an example robust sensing component for an enhanced bit flipping scheme in accordance with various aspects of the present disclosure. Robust sensing scheme 500 may be used to generate a single, high-reliability inversion bit based on multiple inversion bits and may be an example of robust sensing component 275 of FIG. 2. Robust sensing scheme 500 may include first input line 505, second input line 510, differential sensing component 515, and output line 520.

First input line 505 may be used to communicate a logic state stored at a first memory cell to differential sensing component 515. First input line 505 may be a conductive trace or a wireless communication path.

Second input line 510 may be used to communicate a logic state stored at a second memory cell to differential sensing component 515. Second input line 510 may be a conductive trace or a wireless communication path.

Differential sensing component 515 may be used to generate a single, high-reliability bit from the logic values stored in the first and second memory cells. In some cases, the first memory cell may be used to store the value of a first inversion bit for a codeword and the second memory cell may be used to store the value of a second inversion bit for a codeword. The logic value of the first and second inversion bits may be the same. The first memory cell may be polarized in a first direction and the second memory cell may be polarized in a second direction. Using such a scheme may double the sensing window for the collective memory cell and a reference voltage may not be used. When sensed, the memory cells may generate a high and low voltage based on the stored inversion bits, and each voltage may be applied to a differential amplifier, generating a single higher-reliability inversion bit.

Output line 520 may be used to communicate a high-reliability inversion bit generated by differential sensing component 515 to a read component. In some cases, the high-reliability inversion bit may be used to generate or as a flip bit. Output line 520 may be a conductive trace or a wireless communication path.

Figure 6:
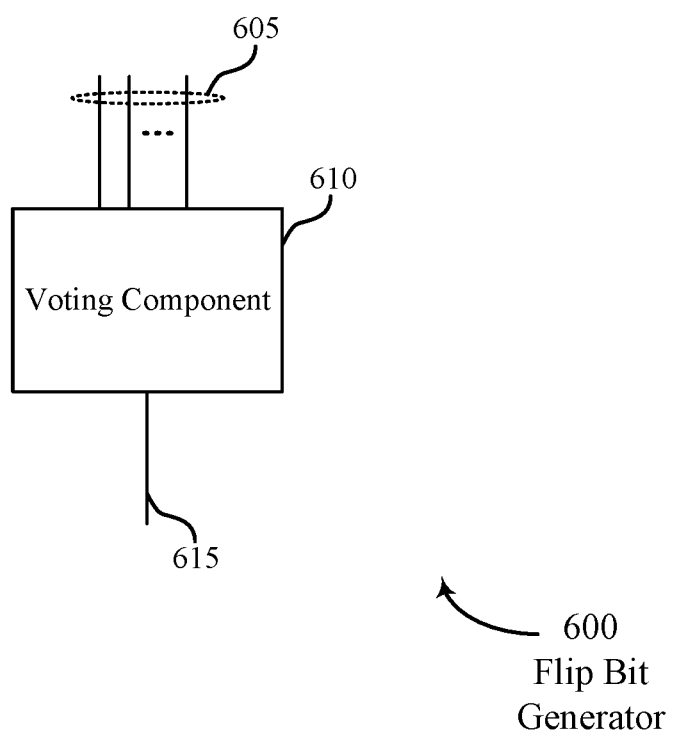
FIG. 6 illustrates an example robust sensing component for an enhanced bit flipping scheme in accordance with various aspects of the present disclosure.

FIG. 6 illustrates an example flip bit generator for an enhanced bit flipping scheme in accordance with various aspects of the present disclosure. Flip bit generator 600 may be used to generate a flip bit based on multiple inversion bits and may be an example of flip bit generator 270 of FIG. 2. Flip bit generator 600 may include input lines 605, voting component 610, and output line 615.

Input lines 605 may be used to communicate the values of multiple inversion bits of a codeword to voting component 610. Input lines 605 may be conductive traces or a wireless communication path. In some cases, input lines 605 may include three or more input lines. In some cases, input lines 605 may be a single input line and may deliver multiple inversion bits to voting component 610 in a serial fashion.

Voting component 610 may be used to implement an error-correction scheme and to determine whether at least some of (e.g., a majority of or all of) the inversion bits indicate that the data bits of the codeword are in an inverted or an original state. Voting component 610 may also increase the reliability of a flip bit as a function of the number of inversion bits. For example, for three inversion bits, the reliability of the flip bit may be 3-choose-2 times $RBER^2$, for four inversion bits, the reliability of the flip bit may be 4-choose-3 times $RBER^3$, and for five inversion bits, the reliability of the flip bit may be 6-choose-3 times $RBER^3$.

In some examples, voting component 610 may identify that two of three inversion bits indicate that the data bits of the codeword are in an inverted state—e.g., based on a value of each of the two inversion bits being a logic 1—and may generate a flip bit that triggers a bit flipping component to flip the data bits—e.g., voting component 610 may determine that the data bits are in an inverted state. Alternatively, voting component 610 may identify that one of three inversion bits indicate that the data bits of the codeword are in an inverted state and may generate a flip bit that does not trigger a bit flipping component to flip the data bits—e.g., voting component 610 may determine that the data bits are in an original state.

Output line 615 may be used to communicate the generated flip bit to a bit flipping component, such as bit flipping component 255 as discussed with reference to FIG. 2. Output line 615 may be a conductive trace or a wireless communication path.

Figure 7:
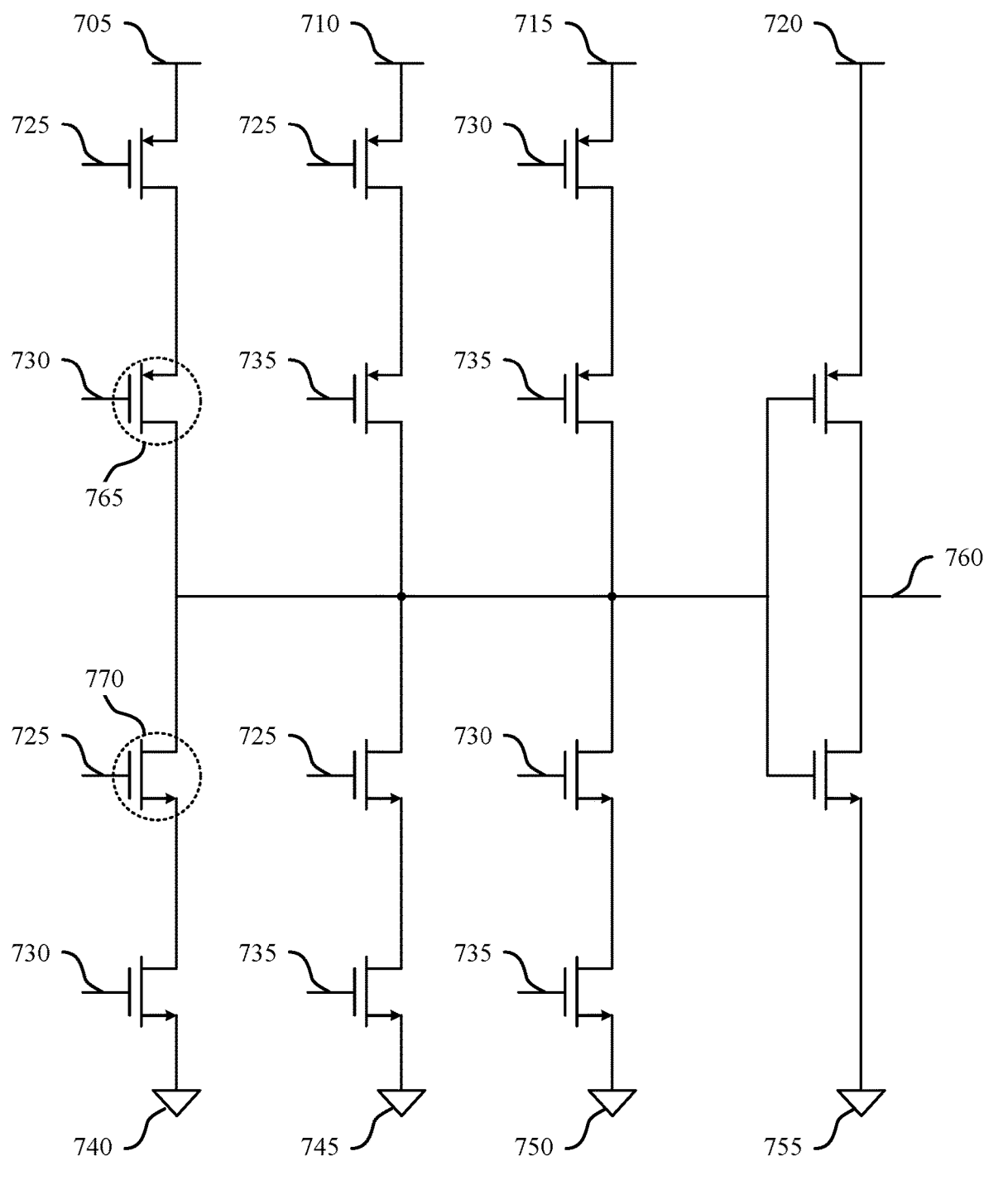
FIG. 7 illustrates an example voting circuit for an enhanced bit flipping scheme in accordance with various aspects of the present disclosure.

FIG. 7 illustrates an example voting circuit for an enhanced bit flipping scheme in accordance with various aspects of the present disclosure. Voting circuit 700 may be used to implement an error correction scheme. In some cases, voting circuit 700 may be used to generate a flip bit using three inversion bits and may be an example of voting component 610 of FIG. 6. Voting circuit 700 may include first voltage source 705, second voltage source 710, third voltage source 715, fourth voltage source 720, fifth voltage source 740, sixth voltage source 745, seventh voltage source 750, eighth voltage source 755, first input line 725, second input line 730, third input line 735, output line 760, p-type transistors 765, and n-type transistors 770.

First voltage source 705, second voltage source 710, third voltage source 715, and fourth voltage source 720 may supply a high voltage (e.g., a positive voltage) for voting circuit 700. In some cases, first voltage source 705, second voltage source 710, third voltage source 715, and fourth voltage source 720 are implemented using a single voltage source—e.g., each of first voltage source 705, second voltage source 710, third voltage source 715, and fourth voltage source 720 may be tied to a high supply rail (e.g., a 3.3V rail).

Fifth voltage source 740, sixth voltage source 745, seventh voltage source 750, and eighth voltage source 755 may supply a low voltage (e.g., virtual ground or a positive voltage) for voting circuit 700. In some cases, fifth voltage source 740, sixth voltage source 745, seventh voltage source 750, and eighth voltage source 755 are implemented using a single voltage source—e.g., each of fifth voltage source 740, sixth voltage source 745, seventh voltage source 750, and eighth voltage source 755 may be tied to a virtual ground.

First input line 725 may be used to communicate a value of a first inversion bit to voting circuit 700. First input line 725 may be connected to multiple p-type transistors 765 and multiple n-type transistors 770.

Second input line 730 may be used to communicate a value of a second inversion bit to voting circuit 700. Second input line 730 may be connected to multiple p-type transistors 765 and multiple n-type transistors 770.

Third input line 735 may be used to communicate a value of a third inversion bit to voting circuit 700. Third input line 735 may be connected to multiple p-type transistors 765 and multiple n-type transistors 770.

Voting circuit 700 may generate an output value that corresponds to a value of the majority of the inversion bits provided to voting circuit 700. That is, voting circuit may generate an output having a value that is the same as the value held by at least two of the three inversion bits.

For example, if the first inversion bit corresponding to first input line 725 has a high voltage (e.g., 3V) corresponding to a logic value 1, the second inversion bit corresponding to second input line 730 has a low voltage corresponding to a logic value 0, the third inversion bit corresponding to third input line 735 has a high voltage corresponding to a logic value 1, then voting circuit 700 may generate an output having a high voltage (e.g., 3.3V). Or, if the first inversion bit corresponding to first input line 725 has a low voltage (e.g., 0V) corresponding to a logic value 0, the second inversion bit corresponding to second input line 730 has a low voltage corresponding to a logic value 0, and the third inversion bit corresponding to third input line 735 has a high voltage corresponding to a logic value 1, then voting circuit 700 may generate an output having a low voltage (e.g., 0V).

Output line 760 may be used to communicate the output value of voting circuit 700 to another component, such as a bit flipping component. In some cases, the output value generated by voting circuit 700 may be the same as a flip bit. In some cases, a high voltage for the flip bit triggers the bit flipping component to flip data bits in a codeword corresponding to the flip bit. And a low voltage for the flip bit may cause the bit flipping component to transmit the data bits in a codeword corresponding to the flip bit on without performing a flipping operation.

Figure 8:
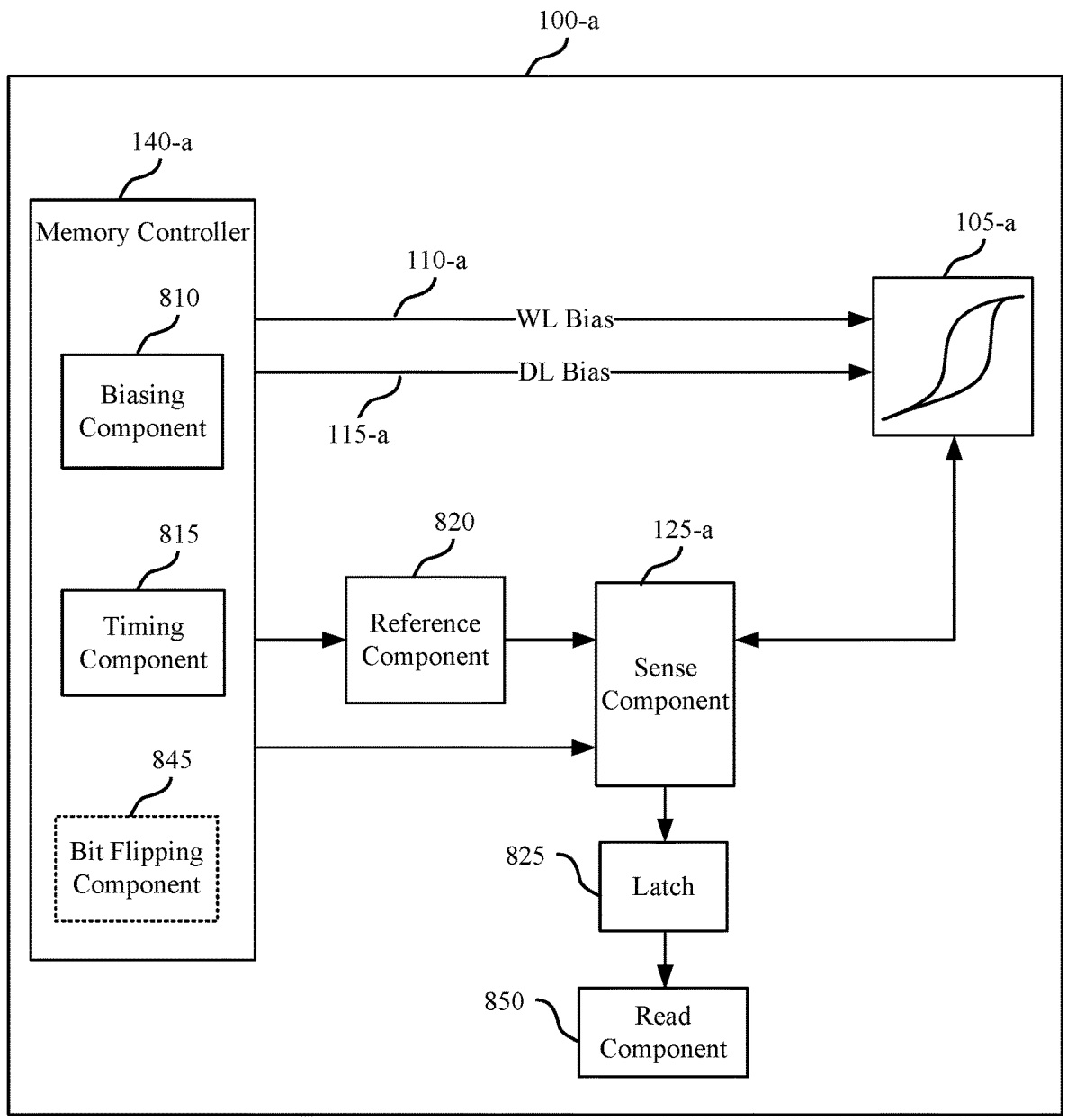
FIG. 8 illustrates a block diagram of a memory array that supports an enhanced bit flipping scheme in accordance with various embodiments of the present disclosure.

FIG. 8 illustrates a block diagram of a memory array that supports an enhanced bit flipping scheme in accordance with various embodiments of the present disclosure. Block diagram 800 may include memory array 100-a, which may be an example of a memory array 100 as discussed with reference to FIG. 1. Memory array 100-a may be referred to as an electronic memory apparatus and includes memory controller 140-a, word line 110-a, bit line 115-a, sense component 125-a, and memory cell(s) 105-a, which may be examples of a memory controller 140, word line 110, bit line 115, sense component 125, and memory cell(s) 105 described with reference to FIG. 1. Memory array 100-a may also include reference component 820, latch 825, and read component 850. The components of memory array 100-a may be in electronic communication with each other and may perform the functions described with reference to FIGS. 1-7.

Memory controller 140-a may, in combination with other components apply voltages throughout memory array 100-a, write data to memory cells 105-a, read data from memory cells 105-a, and generally operate memory array 100-a as described in FIGS. 1-7. Memory controller 140-a may include biasing component 810 and timing component 815. In some cases, memory controller may include bit flipping component 845. Memory controller 140-a may be in electronic communication with memory cell(s) 105-a, sense component 125-a, and reference component 820.

Biasing component 810 may be configured (e.g., by memory controller 140-a) to activate word line 110-a or bit line 115-a by applying voltages to those various nodes. For example, biasing component 810 may be configured to apply a voltage to read or write memory cell 105-a as described herein. In some cases, memory controller 140-a may include a row decoder, column decoder, or both, as described with reference to FIG. 1. This may enable memory controller 140-a to access one or more memory cells 105. Biasing component 810 may also provide voltage potentials to reference component 820 in order to generate a reference signal for sense component 125-a. Additionally, biasing component 810 may provide voltage potentials for the operation of sense component 125-a.

Timing component 815 may be configured to control the timing of the various word line selections or plate biasing, including timing for switching and voltage application to perform the memory functions, such as reading and writing, discussed herein. In some cases, timing component 815 may control the operations of biasing component 810.

Reference component 820 may include various components to generate a reference signal for sense component 125-a. Reference component 820 may include circuitry configured to produce a reference signal.

Sense component 125-a may compare a signal from memory cell(s) 105-a with a reference signal from reference component 820. Upon determining the logic state, the sense component may then store the output in latch 825, where it may be used in accordance with the operations of an electronic device that memory array 100-a is a part. In some cases, reference component 820, sense component 125-a, and latch 825 may be components of memory controller 140-a.

Bit flipping component 845 may be used to manage aspects of an enhanced bit flipping scheme. For instance, bit flipping component 845 may be used to provide timing information to biasing component 810 and/or timing component 815 for a bit flipping operation. Bit flipping component 845 may also include a flip bit generation component and/or a bit flipping component.

Read component 850 may be used to process information bits stored at latch 825. Read component 850 may include aspects of read component 200 as discussed with reference to FIG. 2.

In some cases, memory controller 140-a, in combination with read component 850, may perform an error correction of a codeword that comprises data bits and inversion bits, where the inversion bits indicate whether the data bits are in an inverted state. In some cases, the data and inversion bits of the codeword are stored in memory cells 105-a and a value of the data and inversion bits are sensed by sense component 125-a. Memory controller 140-a, in combination with read component 850, may also generate, concurrent with the error correction, a flip bit based at least in part on a value stored by a number of the inversion bits and transmit the flip bit to a bit flipping component. In some cases, the bit flipping component is included in read component 850.

In some cases, memory controller 140-a, in combination with read component 850, may determine, for a codeword comprising data bits and inversion bits indicating whether the data bits are in an inverted state, whether a majority of the inversion bits indicates that the data bits are in the inverted state. In some cases, the data and inversion bits of the codeword are stored in memory cells 105-a and a value of the data and inversion bits are sensed by sense component 125-a. Memory controller 140-a, in combination with read component 850, may also generate a flip bit based at least in part on determining whether the majority of the inversion bits indicates that the data bits are in the inverted state and transmit the flip bit to a bit flipping component. In some cases, the bit flipping component is included in read component 850.

Figure 9:
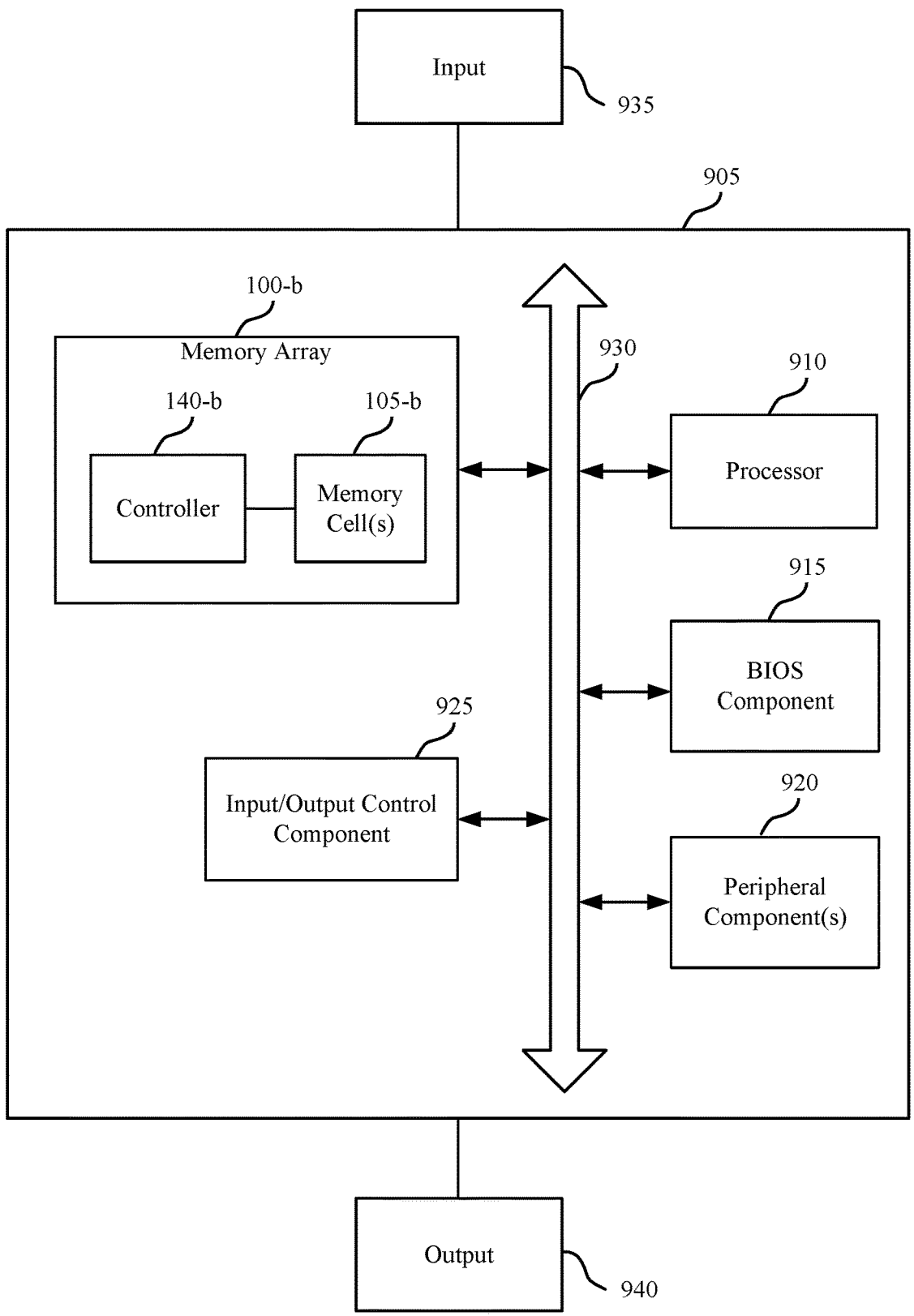
FIG. 9 illustrates a system that supports an enhanced bit flipping scheme in accordance with various embodiments of the present disclosure.

FIG. 9 illustrates a system that supports an enhanced bit flipping scheme in accordance with various embodiments of the present disclosure. System 900 includes a device 905, which may be or include a printed circuit board to connect or physically support various components. Device 905 includes a memory array 100-b, which may be an example of memory array 100 described with reference to FIGS. 1 and 8. Memory array 100-b may contain memory controller 140-b and memory cell(s) 105-b, which may be examples of a memory controller 140 and memory cell(s) 105 as described with reference to FIGS. 1 and 8. Device 905 may also include a processor 910, BIOS component 915, peripheral component(s) 920, and input/output control component 925. The components of device 905 may be in electronic communication with one another through bus 930.

Processor 910 may be configured to operate memory array 100-b through memory controller 140-b. In some cases, processor 910 may perform the functions of memory controller 140 described with reference to FIGS. 1 and 8. In other cases, memory controller 140-b may be integrated into processor 910. Processor 910 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 910 may perform various functions described herein. Processor 910 may, for example, be configured to execute computer-readable instructions stored in memory array 100-b to cause device 905 perform various functions or tasks.

BIOS component 915 may be a software component that includes a basic input/output system (BIOS) operated as firmware, which may initialize and run various hardware components of system 900. BIOS component 915 may also manage data flow between processor 910 and the various components, e.g., peripheral components 920, input/output control component 925, etc. BIOS component 915 may include a program or software stored in read-only memory (ROM), flash memory, or any other non-volatile memory.

Peripheral component(s) 920 may be any input or output device, or an interface for such devices, that is integrated into device 905. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 925 may manage data communication between processor 910 and peripheral component(s) 920, input devices 935, or output devices 940. Input/output control component 925 may also manage peripherals not integrated into device 905. In some cases, input/output control component 925 may represent a physical connection or port to the external peripheral.

Input 935 may represent a device or signal external to device 905 that provides input to device 905 or its components. This may include a user interface or interface with or between other devices. In some cases, input 935 may be a peripheral that interfaces with device 905 via peripheral component(s) 920 or may be managed by input/output control component 925.

Output 940 may represent a device or signal external to device 905 configured to receive output from device 905 or any of its components. Examples of output 940 may include a display, audio speakers, a printing device, another processor or printed circuit board, etc. In some cases, output 940 may be a peripheral that interfaces with device 905 via peripheral component(s) 920 or may be managed by input/output control component 925.

The components of memory controller 140-b, device 905, and memory array 100-b may be made up of circuitry designed to carry out their functions. This may include various circuit elements, for example, conductive lines, transistors, capacitors, inductors, resistors, amplifiers, or other active or inactive elements, configured to carry out the functions described herein.

Figure 10:
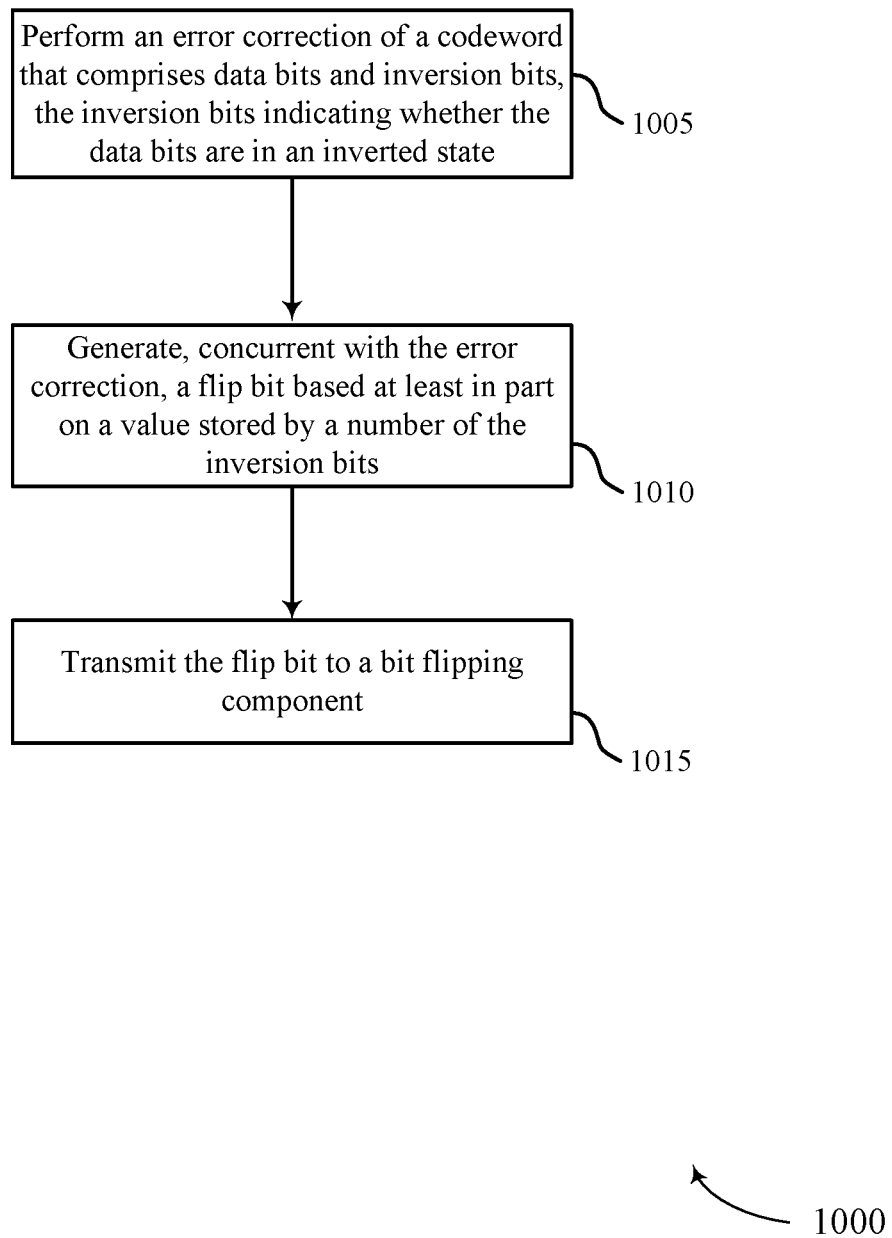
FIGS. 10 and 11 illustrate aspects of a method or methods for an enhanced bit flipping scheme in accordance with various embodiments of the present disclosure.

FIG. 10 illustrates aspects of a method or methods for an enhanced bit flipping scheme in accordance with various embodiments of the present disclosure. Method 1000 may illustrate aspects of processing a codeword during a read operation.

At block 1005, the method may include performing an error correction of a codeword that comprises data bits and inversion bits, the inversion bits indicating whether the data bits are in an inverted state, as described with reference to FIGS. 1-7. In certain examples, the operations of block 1005 may be performed or facilitated by an error identification component or memory controller, as described with reference to FIGS. 1, 2, 8 and 9.

At block 1010, the method may include generating, concurrent with the error correction, a flip bit based at least in part on a value stored by a number of the inversion bits, as described with reference to FIGS. 1-7. In certain examples, the operations of block 1010 may be performed or facilitated by a flip bit generator or memory controller, as described with reference to FIGS. 1, 2, 6-8, and 9.

At block 1015, the method may include transmitting the flip bit to a bit flipping component, as described with reference to FIGS. 1-7. In certain examples, the operations of block 1015 may be performed or facilitated by a bit flipping component or memory controller, as described with reference to FIGS. 1, 2, 8, and 9.

Figure 11:
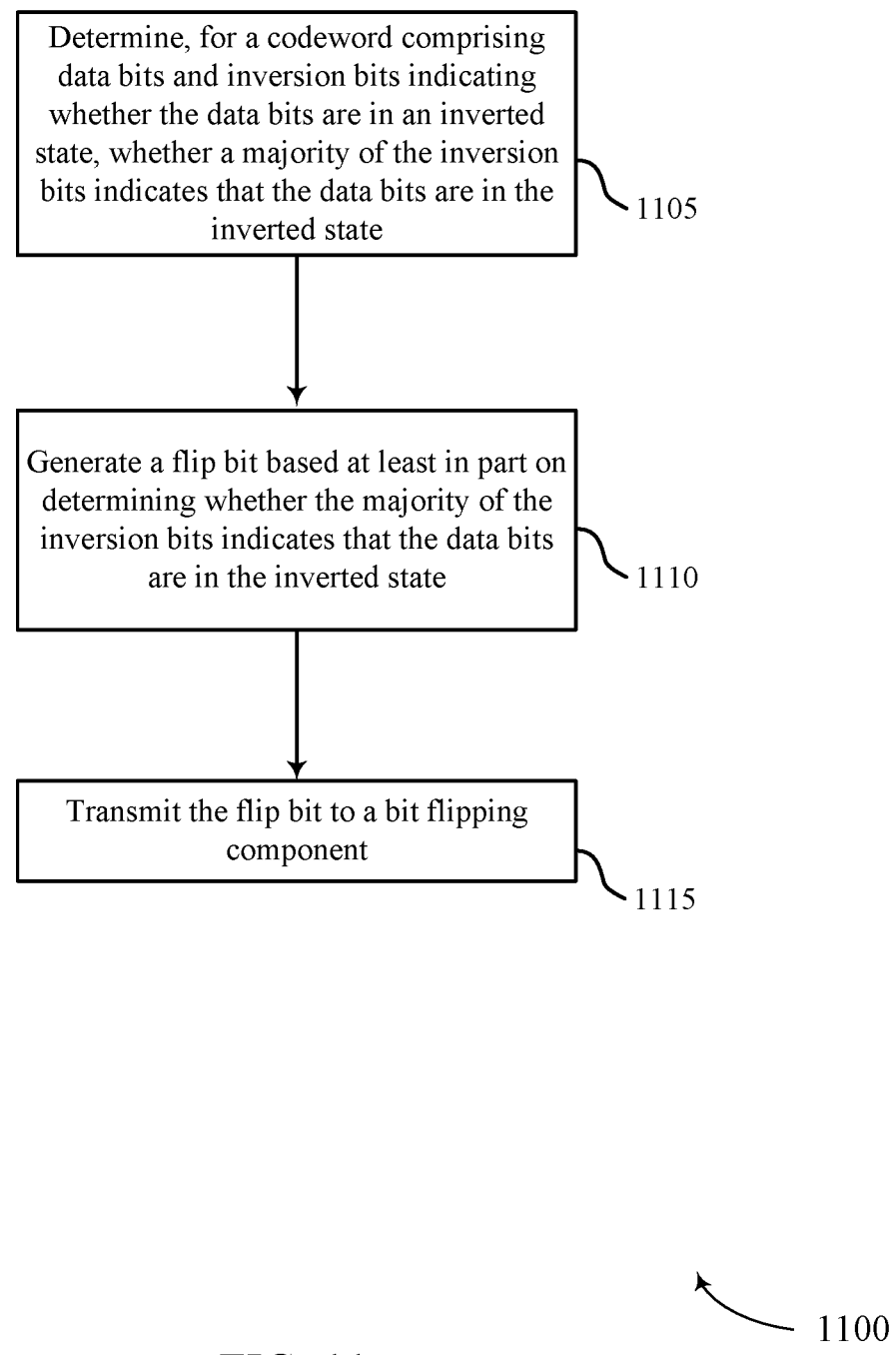

FIG. 11 illustrates a flowchart of a method or methods for an enhanced bit flipping scheme in accordance with various embodiments of the present disclosure. Method 1100 may illustrate aspects of processing a codeword during a read operation.

At block 1105, the method may include determining, for a codeword comprising data bits and inversion bits indicating whether the data bits are in an inverted state, whether a majority of the inversion bits indicates that the data bits are in the inverted state, as described with reference to FIGS. 1-7. In certain examples, the operations of block 1105 may be performed or facilitated by a flip bit generator, voting component, or memory controller, as described with reference to FIGS. 1, 2, 6-8, and 9.

At block 1110, the method may include generating a flip bit based at least in part on determining whether the majority of the inversion bits indicates that the data bits are in the inverted state, as described with reference to FIGS. 1-7. In certain examples, the operations of block 1110 may be performed or facilitated by a flip bit generator or memory controller, as described with reference to FIGS. 1, 2, 6-8, and 9.

At block 1115, the method may include transmitting the flip bit to a bit flipping component, as described with reference to FIGS. 1-7. In certain examples, the operations of block 1115 may be performed or facilitated by a bit flipping component or memory controller, as described with reference to FIGS. 1, 2, 8, and 9.

In some examples, an apparatus as described herein may perform a method or methods, such as the method 1000. The apparatus may include features, means, or instructions (e.g., a non-transitory computer-readable medium storing instructions executable by a processor) for performing an error correction of a codeword that includes data bits and inversion bits, the inversion bits indicating whether the data bits are in an inverted state, generating, concurrent with the error correction, a flip bit based on a value stored by a number of the inversion bits, and transmitting the flip bit to a bit flipping component.

Some examples of the method, apparatuses, and non-transitory computer-readable medium described herein may further include operations, features, means, or instructions for determining whether the data bits may be in the inverted state based on the value stored by each of the number of the inversion bits, where the flip bit may be generated based on determining whether the data bits may be in the inverted state.

Some examples of the method, apparatuses, and non-transitory computer-readable medium described herein may further include operations, features, means, or instructions for determining that a majority of the inversion bits indicates that the data bits may be in the inverted state by comparing the value stored by each of the number of the inversion bits and determining that the data bits may be in the inverted state based on determining that the majority of the inversion bits indicate that the data bits may be in the inverted state.

Some examples of the method, apparatuses, and non-transitory computer-readable medium described herein may further include operations, features, means, or instructions for flipping the data bits based on determining that the data bits may be in the inverted state and transmitting the data bits a memory buffer after the data bits may be flipped.

Some examples of the method, apparatuses, and non-transitory computer-readable medium described herein may further include operations, features, means, or instructions for determining that a minority of the inversion bits indicates that the data bits may be in the inverted state by comparing the value stored by each of the number of the inversion bits, determining that the data bits may be in an original state based on determining that the minority of the inversion bits indicate that the data bits may be in the inverted state and transmitting the data bits to a memory buffer.

In some examples of the method, apparatuses, and non-transitory computer-readable medium described herein, performing the error correction may include operations, features, means, or instructions for generating syndrome bits for the data bits while or after generating the flip bit.

Some examples of the method, apparatuses, and non-transitory computer-readable medium described herein may further include operations, features, means, or instructions for transmitting the data bits to a bit correction component coupled with the bit flipping component and transmitting the syndrome bits to the bit correction component after the flip bit may be transmitted to the bit flipping component.

Some examples of the method, apparatuses, and non-transitory computer-readable medium described herein may further include operations, features, means, or instructions for determining whether a data bit of the data bits may be corrupted during the error correction, where the syndrome bits may be generated based on determining whether the data bit of the data bits may be corrupted.

In some examples of the method, apparatuses, and non-transitory computer-readable medium described herein, an RBER or a UBER of the flip bit may be equal to or greater than a UBER of a data bit of the data bits.

In some examples of the method, apparatuses, and non-transitory computer-readable medium described herein, a section of memory may include operations, features, means, or instructions for performing, for each codeword, an error correction operation, determining, for each codeword and independent of an error correction of the codeword, a value of a flip bit based on inversion bits and transmitting, for each codeword, the flip bit to a bit flipping component.

In some examples, an apparatus as described herein may perform a method or methods, such as the method 1100. The apparatus may include features, means, or instructions (e.g., a non-transitory computer-readable medium storing instructions executable by a processor) for determining, for a codeword including data bits and inversion bits indicating whether the data bits are in an inverted state, whether a majority of the inversion bits indicates that the data bits are in the inverted state, generating a flip bit based on determining whether the majority of the inversion bits indicates that the data bits are in the inverted state, and transmitting the flip bit to a bit flipping component.

Some examples of the method, apparatuses, and non-transitory computer-readable medium described herein may further include operations, features, means, or instructions for performing an error correction of the codeword, generating syndrome bits for the data bits based on the error correction and transmitting the syndrome bits, concurrent with transmitting the flip bit to the bit flipping component, to a bit correction component that may be coupled with the bit flipping component.

Some examples of the method, apparatuses, and non-transitory computer-readable medium described herein may further include operations, features, means, or instructions for performing an error correction of the codeword, generating syndrome bits for the data bits based on the error correction, transmitting the data bits to a bit correction component that may be coupled with the bit flipping component and transmitting the syndrome bits to the bit correction component after transmitting the flip bit to the bit flipping component.

In some examples of the method, apparatuses, and non-transitory computer-readable medium described herein, a first error rate associated with the flip bit may be equal to or greater than a second error rate associated with the data bits. It should be noted that the methods described herein describe possible implementations, and that the operations and the steps may be rearranged or otherwise modified and that other implementations are possible. Furthermore, embodiments from two or more of the methods may be combined.

In some examples, an apparatus or device may perform aspects of the functions described herein using general, or special-purpose hardware. For example, an apparatus or device may include a data component configured to process data bits, a control component configured to process control bits that comprise inversion bits indicating whether the data bits are in an inverted state, an error identification component coupled with the data component and the control component, the error identification component configured to identify errors in the data bits, and a flip bit generator configured to determine whether the data bits are in the inverted state based on whether a majority of the inversion bits indicates that the data bits are in the inverted state. In some cases, the control bits comprise error correction bits and redundant bits.

In some examples of the apparatus or device, the flip bit generator is included within the control component and is configured to generate a flip bit based at least in part on whether the majority of the data bits are in the inverted state and transmit the flip bit to the data component. In some examples, the flip bit generator is configured to transmit the flip bit to the data component before or while the syndrome bits are transmitted to the data component. In some examples, the flip bit generator is configured to determine whether the data bits are in the inverted state independent of an output of the error identification component.

In some examples of the apparatus or device, the error identification component is configured to transmit syndrome bits to the data component based at least in part on the errors identified in the data bits. In some cases, the error identification component and the flip bit generator are operated independently of one another.

In some examples, the apparatus or device includes a bit flipping component that is configured to flip the data bits based at least in part on the flip bit. In some cases, the data component comprises the bit flipping component. In some examples, the apparatus or device includes a memory array comprising the data component, the control component, and memory sections, where each memory section comprising codewords.

In some examples, the apparatus or device includes one or more error identification components configured to identify, for each codeword in a memory section, errors in the data bits, where the one or more error identification components comprise the error identification component.

In some examples, the apparatus or device includes one or more flip bit generators configured to determine, for each codeword in a memory section, whether the data bits are in the inverted state, where the one or more flip bit generators comprise the flip bit generator, and where the one or more error identification components and the one or more flip bit generators are operated independently of one another.

In other examples, an apparatus or device may include a memory array comprising first memory cells configured to store data bits and second memory cells configured to store control bits that comprise inversion bits, a repair component coupled with the memory array, the repair component configured to replace a subset of the data bits and a subset of the control bits, an error identification component coupled with an output of the repair component, the error identification component configured to identify errors in the data bits after the subset of the data bits is replaced, and a voting component coupled with the output of the repair component, the voting component configured to determine, concurrent with the identification of errors in the data bits by the error identification component, whether a majority of inversion bits indicates that the data bits are in an inverted state.

In some examples of the apparatus or device, the voting component is electrically isolated from the error identification component. In some examples of the apparatus or device, the repair component includes a first multiplexer configured to replace the subset of the data bits and a second multiplexer configured to replace the subset of the control bits.

In some examples, the apparatus or device includes a bit correction component coupled with the output of the first multiplexer and the error identification component, the bit correction component configured to correct the errors in the data bits. In some examples, the apparatus or device includes a flipping component coupled with the voting component and the bit correction component, where the flipping component is configured to flip the data bits after the errors in the data bits are corrected.

In other examples, an apparatus or device may include an error identification component configured to perform an error correction of a codeword that comprises data bits and inversion bits, the inversion bits indicating whether the data bits are in an inverted state, a flip bit generator coupled with the error identification component, the flip bit generator configured to generate a flip bit based at least in part on a value stored by a subset of the inversion bits, and a bit flipping component coupled with the flip bit generator, the bit flipping component configured to receive the flip bit from the flip bit generator and to flip the data bits based at least in part on a value of the flip bit.

In some examples of the apparatus or device, the flip bit generator includes a voting component, where the voting component is configured to determine whether a majority of the inversion bits indicate that the data bits are in the inverted state. In some cases, the flip bit is generated based at least in part on the determining.

In some examples, the apparatus or device includes a bit correction component coupled with the error identification component and the flip bit generator. In some cases, the bit correction component is configured to correct errors in the data bits. In some cases, the error identification component is further configured to generate syndrome bits for the data bits and transmit the syndrome bits to the bit correction component, the bit correction component configured to correct the errors in the data bits based at least in part on the syndrome bits. In some cases, the flip bit generator is configured to transmit the flip bit to the bit flipping component before or while the syndrome bits are transmitted to the bit correction component.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components.

Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" or "electrically isolated" refers to a relationship between components in which electrons are not presently capable of flowing between them; components are isolated from each other if there is an open circuit between them. For example, two components physically connected by a switch may be isolated from each other when the switch is open.

As used herein, the term "substantially" means that the modified characteristic (e.g., a verb or adjective modified by the term substantially) need not be absolute but is close enough so as to achieve the advantages of the characteristic.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The detailed description set forth above in connection with the appended drawings describes examples and does not represent the only examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. An apparatus, comprising:
   a memory array comprising first memory cells configured to store data bits and second memory cells configured to store control bits that include inversion bits;
   a repair component coupled with the memory array and configured to replace a subset of the data bits and a subset of the control bits;
   an error identification component coupled with an output of the repair component and configured to identify one or more errors in the data bits after the subset of the data bits is replaced; and
   a voting component coupled with the output of the repair component and configured to determine, concurrent with identifying the one or more errors in the data bits by the error identification component, whether a majority of the inversion bits indicates that the data bits are in an inverted state.

2. The apparatus of claim 1, further comprising:
   a bit flipping component coupled with the voting component, the bit flipping component configured to flip the data bits after the one or more errors in the data bits are corrected based at least in part on an output of the voting component.

3. The apparatus of claim 2, wherein:
   the voting component is configured to generate a flip bit based at least in part on whether the majority of the inversion bits indicates that the data bits are in the inverted state and indicates the flip bit to the bit flipping component, and
   the bit flipping component is further configured to flip the data bits based at least in part on the flip bit.

4. The apparatus of claim 2, wherein the bit flipping component is further configured to output a flipped version of the error-corrected data bits based at least in part on flipping the data bits after the one or more errors in the data bits are corrected.

5. The apparatus of claim 1, wherein the voting component is electrically isolated from the error identification component.

6. The apparatus of claim 1, the repair component comprising:
   a first multiplexer configured to replace the subset of the data bits; and
   a second multiplexer configured to replace error correction bits of the control bits.

7. The apparatus of claim 6, wherein the repair component comprises:
   a third multiplexer configured to replace the inversion bits of the control bits.

8. The apparatus of claim 6, further comprising:
   a bit correction component coupled with the first multiplexer and the error identification component, the bit correction component configured to correct the one or more errors in the data bits.

9. The apparatus of claim 8, further comprising:
   a syndrome bit decoder configured to identify a location of the one or more errors in the data bits and to indicate the location of the one or more errors to the bit correction component, wherein the bit correction component is further configured to correct the one or more errors in the data bits based at least in part on an indication of the location of the one or more errors.

10. The apparatus of claim 1, wherein:
    a subset of the second memory cells stores the inversion bits, the subset of the second memory cells including at least three memory cells; and
    wherein the voting component comprises one or more input lines coupled with the subset of the second memory cells.

11. A method, comprising:
    reading data bits from first memory cells and control bits from second memory cells, the control bits comprising inversion bits;
    replacing a subset of the data bits and a subset of the control bits based at least in part on reading the data bits and the control bits;
    identifying one or more errors in the data bits after the subset of the data bits is replaced; and determining, concurrent with the identifying the one or more errors in the data bits, whether a majority of the inversion bits indicates that the data bits are in an inverted state.

12. The method of claim 11, further comprising:

flipping the data bits after the one or more errors in the data bits are corrected based at least in part on determining that the majority of the inversion bits indicates that the data bits are in the inverted state.

13. The method of claim 12, further comprising:

generating a flip bit based at least in part on determining whether the majority of the inversion bits indicates that the data bits are in the inverted state, wherein flipping the data bits is based at least in part on the flip bit.

14. The method of claim 12, further comprising:

outputting a flipped version of the error-corrected data bits based at least in part on flipping the data bits after the one or more errors in the data bits are corrected.

15. The method of claim 12, further comprising:

identifying a location of the one or more errors in the data bits based at least in part on the one or more errors identified in the data bits; and correcting the one or more errors in the data bits based at least in part on the location of the one or more errors.

16. An apparatus, comprising:

a memory array comprising first memory cells and second memory cells;

a controller coupled with the memory array, the controller configured to:

read data bits from the first memory cells and control bits from the second memory cells, the control bits comprising inversion bits;

replace a subset of the data bits and a subset of the control bits;

identify one or more errors in the data bits after the subset of the data bits is replaced; and determine, concurrent with identifying the one or more errors in the data bits, whether a majority of the inversion bits indicates that the data bits are in an inverted state.

17. The apparatus of claim 16, wherein the controller is further configured to:

flip the data bits after the one or more errors in the data bits are corrected based at least in part on determining that the majority of the inversion bits indicates that the data bits are in the inverted state.

18. The apparatus of claim 17, wherein the controller is further configured to:

generate a flip bit based at least in part on determining whether the majority of the inversion bits indicates that the data bits are in the inverted state, wherein flipping the data bits is based at least in part on the flip bit.

19. The apparatus of claim 17, wherein the controller is further configured to:

output a flipped version of the error-corrected data bits based at least in part on flipping the data bits after the one or more errors in the data bits are corrected.

20. The apparatus of claim 17, wherein the controller is further configured to:

identify a location of the one or more errors in the data bits based at least in part on the one or more errors identified in the data bits; and correct the one or more errors in the data bits based at least in part on the location of the one or more errors.

* * * * *